(12) United States Patent
Wang et al.

(10) Patent No.: US 12,490,488 B2
(45) Date of Patent: Dec. 2, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chieh-Ping Wang, Taichung (TW); Ting-Gang Chen, Taipei (TW); Tai-Chun Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 768 days.

(21) Appl. No.: 17/743,510

(22) Filed: May 13, 2022

(65) Prior Publication Data

US 2023/0369452 A1 Nov. 16, 2023

(51) Int. Cl.
| | |
|---|---|
| *H10D 64/01* | (2025.01) |
| *H10D 30/01* | (2025.01) |
| *H10D 30/62* | (2025.01) |
| *H10D 62/10* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 64/017* (2025.01); *H10D 30/024* (2025.01); *H10D 30/6211* (2025.01); *H10D 30/6219* (2025.01); *H10D 62/115* (2025.01); *H10D 84/013* (2025.01); *H10D 84/0158* (2025.01); *H10D 84/038* (2025.01); *H10D 84/834* (2025.01)

(58) Field of Classification Search
CPC ............... H10D 30/115; H10D 30/024; H10D 30/6219; H10D 62/115; H10D 64/017; H10D 84/013; H10D 84/0158; H10D 84/834; H10D 84/038
USPC ......................................................... 257/288
See application file for complete search history.

(56) References Cited

U.S. PATENT DOCUMENTS

| | | | | |
|---|---|---|---|---|
| 2017/0125411 A1* | 5/2017 | Yu | ........................ | H10D 84/834 |
| 2020/0176259 A1* | 6/2020 | Lee | .................... | H10D 84/0151 |
| 2021/0313181 A1* | 10/2021 | Chen | .................. | H10D 84/0151 |
| 2022/0319831 A1* | 10/2022 | Kengoyama | ........ | C23C 16/4554 |
| 2022/0359225 A1* | 11/2022 | More | .................. | H10D 84/0151 |

* cited by examiner

*Primary Examiner* — Igwe U Anya

(74) *Attorney, Agent, or Firm* — NZ Carr Law Office

(57) ABSTRACT

Methods of forming a semiconductor device structure are described. In some embodiments, the method includes forming fins from a substrate, forming a dummy gate stack over portions of the fins, forming epitaxial source/drain regions adjacent the dummy gate stack, depositing a first inter-layer dielectric (ILD) over the epitaxial source/drain region, replacing the dummy gate stack with a first gate stack, forming a trench through the first gate stack and into an isolation region under the first gate stack, and forming a dielectric layer in the trench by an atomic layer deposition process, wherein the dielectric layer is non-conformal.

20 Claims, 43 Drawing Sheets

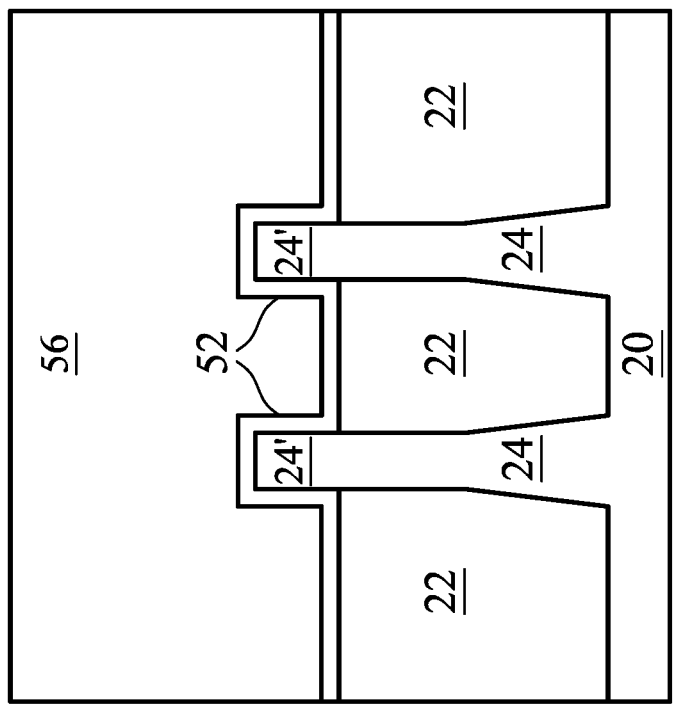
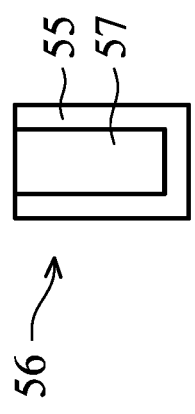
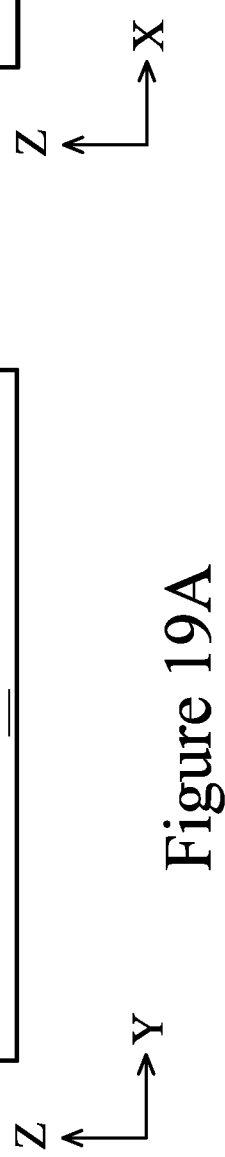
Figure 19B
Figure 19B-1
Figure 19A

SEMICONDUCTOR DEVICE STRUCTURE AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 9, 10A through 13B, 14, 15A, 15B, 16, 17A, 17B, 18, 19A, 19B, 19B-1, 20, 21A, 21B, 22, 23, 24A through 27-1, 29A through 31C illustrate various views of intermediate stages in the manufacturing of the semiconductor device structure, in accordance with some embodiments.

DETAILED DESCRIPTION

Figure 1:
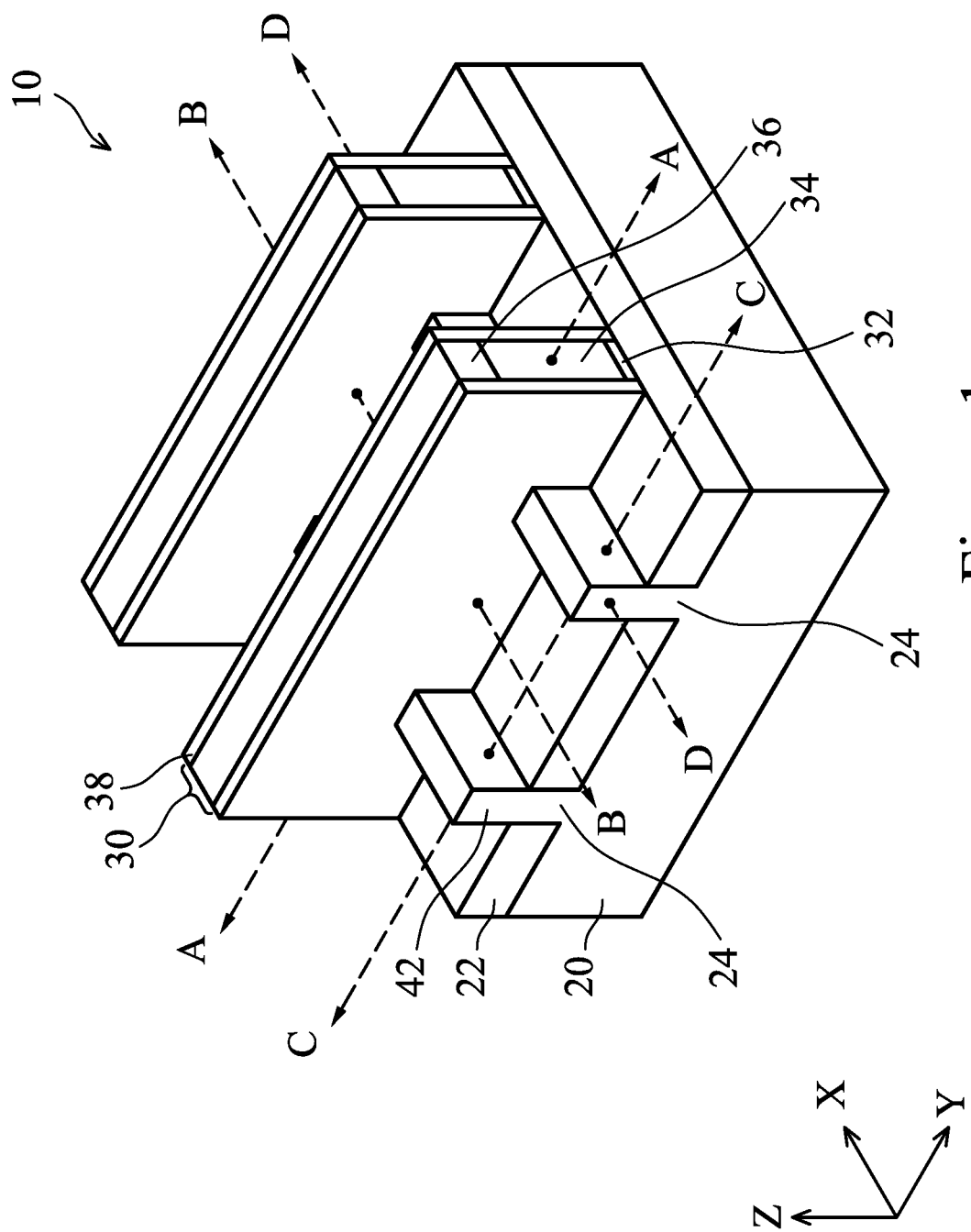
FIG. 1 illustrates an example of a semiconductor device structure in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFET devices can be formed by forming semiconductor strips (i.e., fins) from a substrate and forming a gate over and perpendicular to the semiconductor strips. These semiconductor strips or gates may subsequently be cut into various lengths or sizes to provide different FinFET transistors based on particular design needs. Rather than cut a dummy gate prior to replacing the dummy gate with a replacement gate, embodiment processes use a gate cutting technique which cuts a replacement gate (e.g., a metal gate) to form distinct gates over different adjacent FinFET transistors. As technology advances and the sizes of the FinFET structures decrease, leakage between the cut replacement gates may become more problematic due to the decreased spacing between the cut ends of the gate. To help prevent or to reduce current leakage from one gate to another, embodiments form a dielectric material between the two cut gates which has an air gap or void disposed between the ends of the cut gates. The air gap provides enhanced insulating capabilities over the dielectric material and as a result the leakage current from one gate to the other gate is reduced.

FIG. 1 illustrates an example of a semiconductor device structure 10 in a three-dimensional view, in accordance with some embodiments. In some embodiments, the semiconductor device structure 10 includes a FinFET, as shown in FIG. 1. The semiconductor device structure 10 includes a fin 24 on a substrate 20 (e.g., a semiconductor substrate). Isolation regions 22 are disposed in the substrate 20, and the fin 24 protrudes above and from between neighboring isolation regions 22. Although the isolation regions 22 are described/illustrated as being separate from the substrate 20, as used herein the term "substrate" may be used to refer to just the semiconductor substrate or a semiconductor substrate inclusive of isolation regions. Additionally, the fin 24 may be a single continuous material, or the fin 24 and/or the substrate 20 may comprise a plurality of materials. In this context, the fin 24 refers to the portion extending between the neighboring isolation regions 22.

A gate dielectric layer 32 is along sidewalls and over a top surface of the fin 24, and a gate electrode 34 is over the gate dielectric layer 32. In this illustration, the gate electrode 34 and gate dielectric layer 32 may be dummies and may be replaced with a replacement gate in a subsequent process. A mask 36 is over the gate electrode 34. Epitaxial source/drain regions 42 are disposed on opposite sides of the fin 24 with respect to the gate dielectric layer 32 and gate electrode 34. The gate dielectric layer 32 and gate electrode 34, along with any interfacial layers (not shown) are taken together as the gate stack 30. A gate spacer 38 disposed on either side of the gate stack 30 and around the epitaxial source/drain regions 42. FIG. 1 further illustrates reference cross-sections that are used in later figures. Cross-section A-A is along a longitudinal axis of the gate electrode 34. Cross-section B-B is perpendicular to the cross-section A-A and is along a longitudinal axis of the fin 24. Cross-section C-C is parallel to the cross-section A-A and extends through epitaxial source/drain regions 42 of the FinFET. Cross section D-D is parallel to cross-section B-B and extends through the fin 24. Subsequent figures refer to these reference cross-sections for clarity.

Some embodiments discussed herein are discussed in the context of FinFETs formed using a gate-last process, and the gate stack 30 is a dummy gate stack. In other embodiments, a gate-first process may be used. Also, some embodiments contemplate aspects used in planar devices, such as planar FETs, or in nanostructure devices, such as gate-all-around (GAA) FETs, nanosheet FETs or nanowire FETs.

Figure 3:
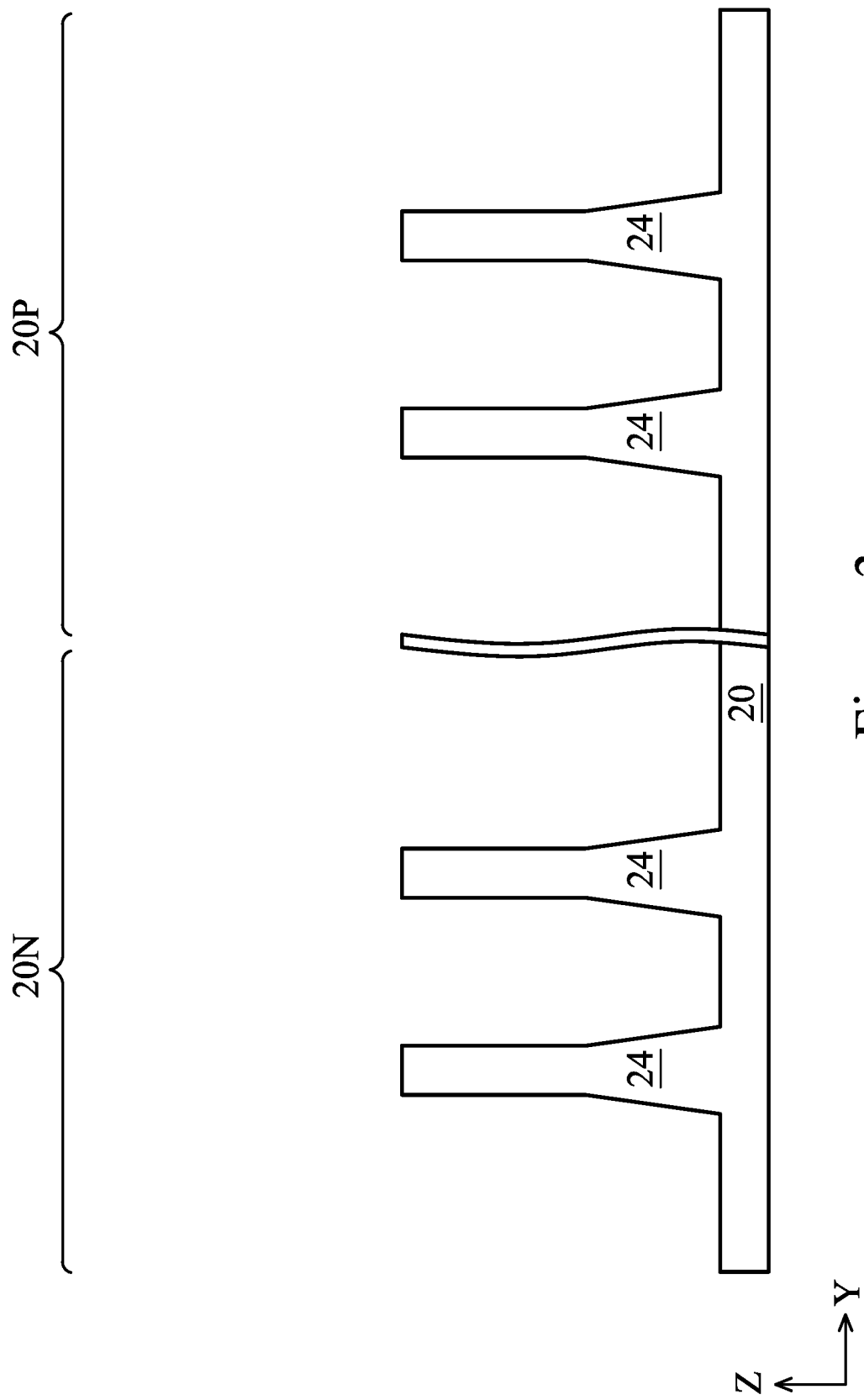
Figure 4:
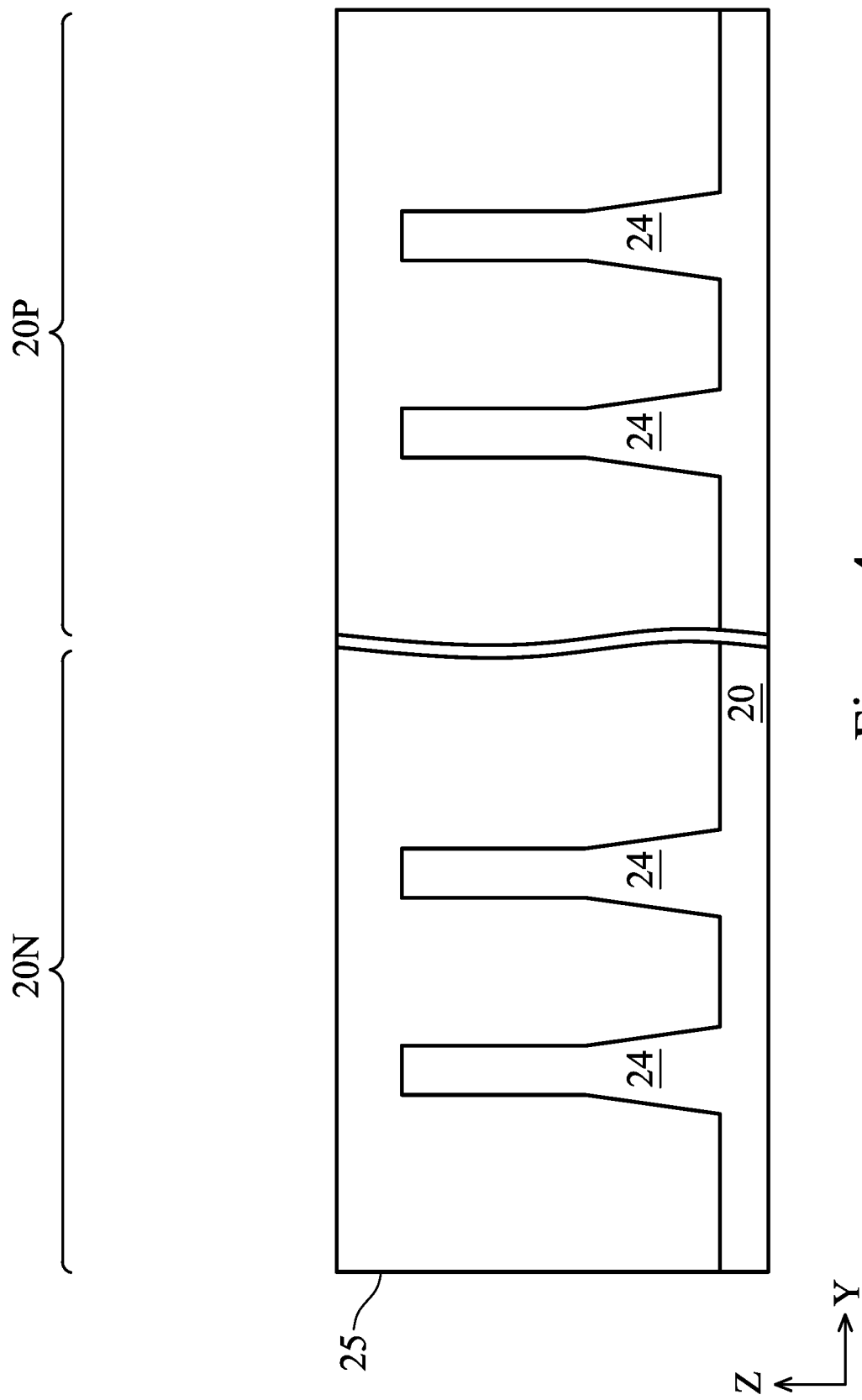
Figure 5:
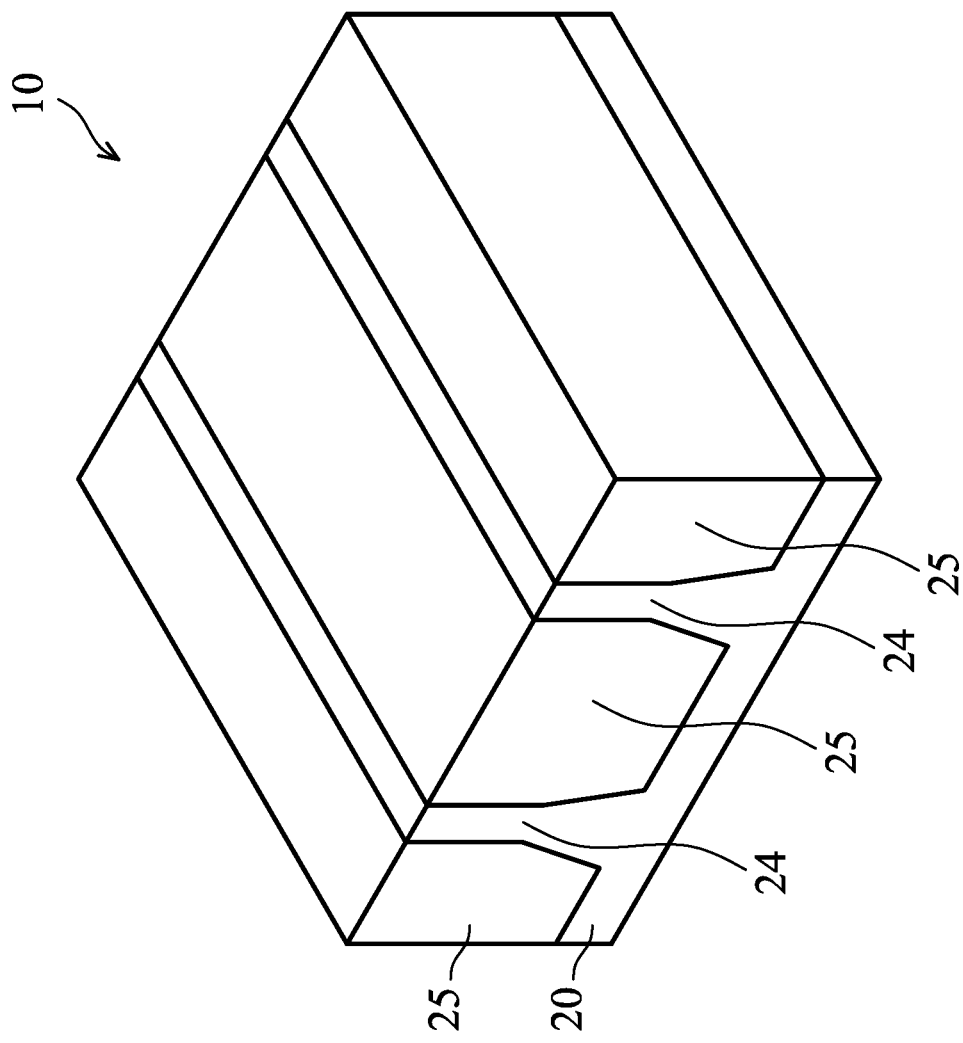
Figure 6:
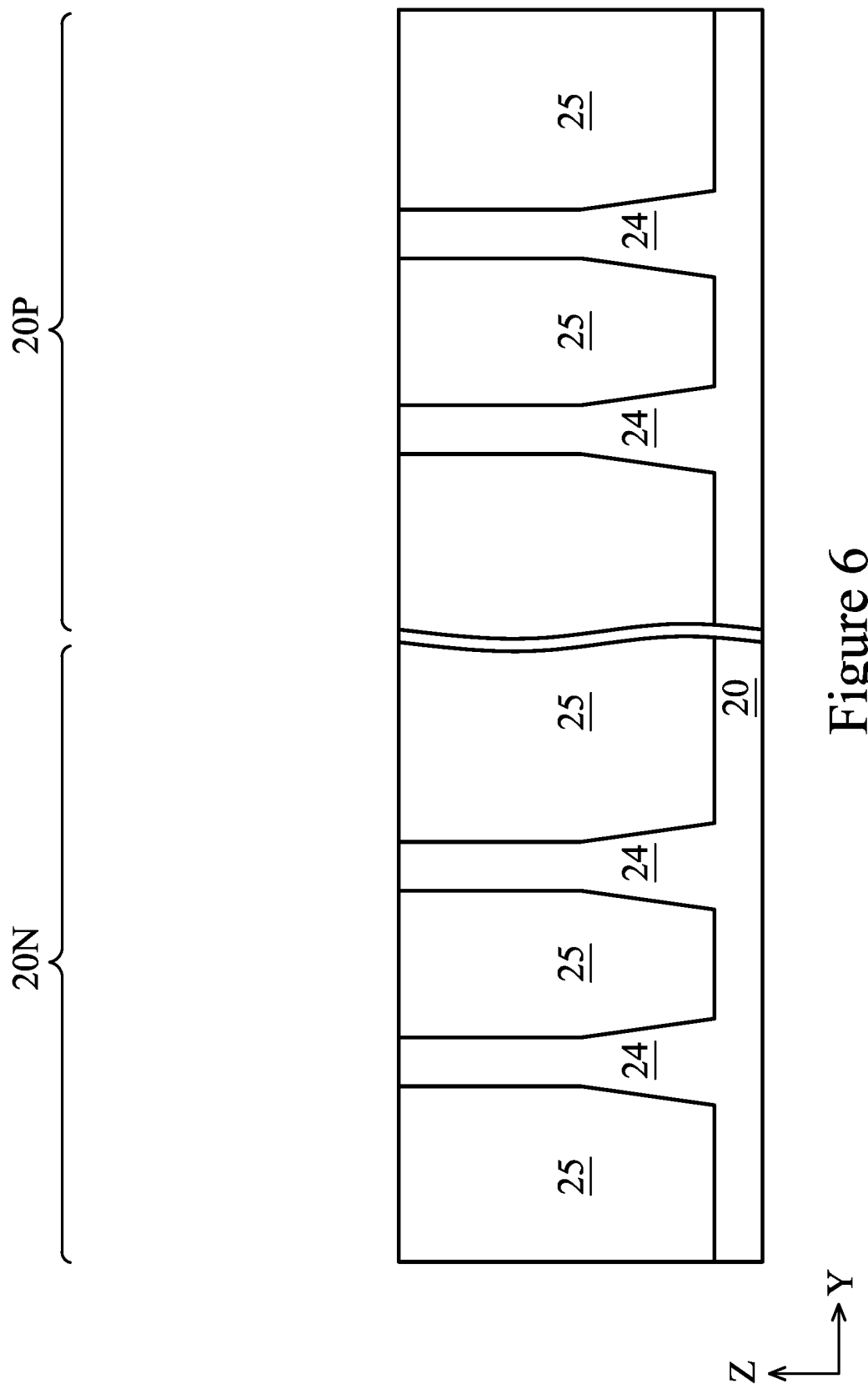
Figure 7:
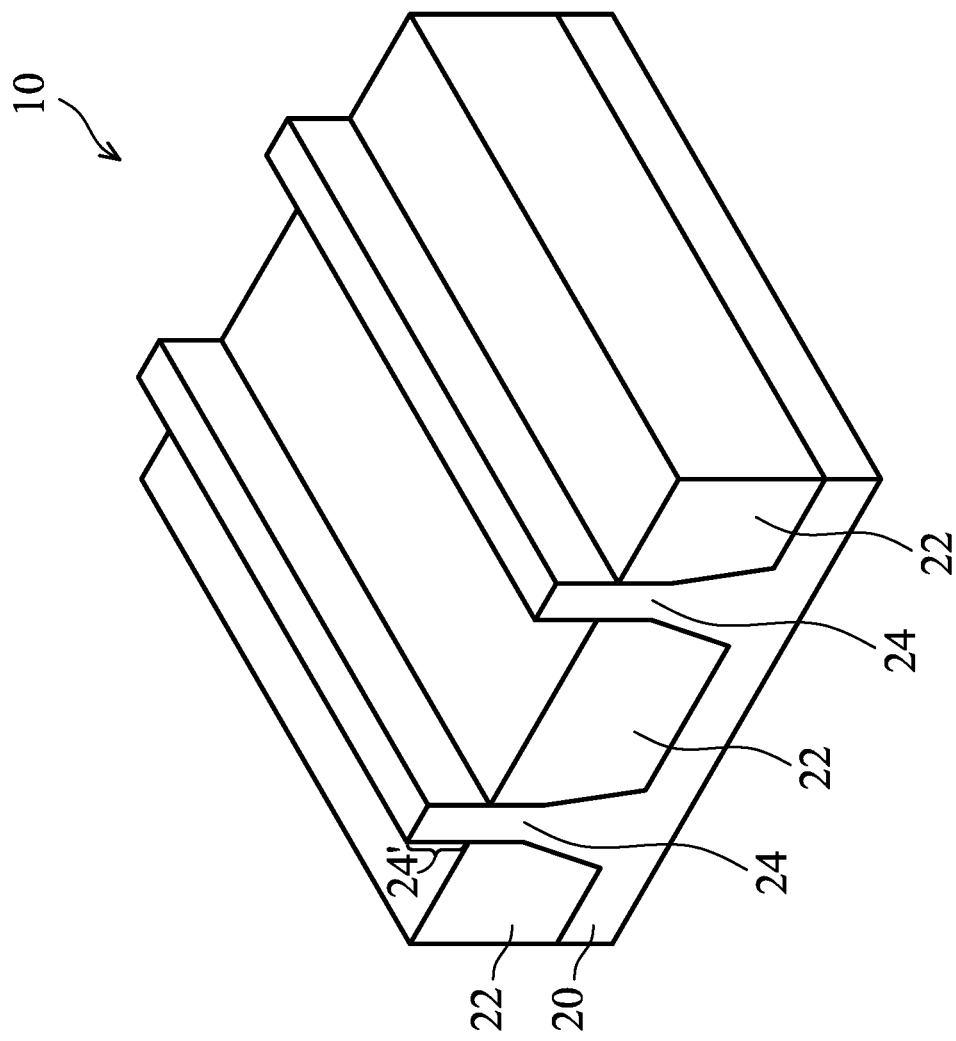

FIGS. 2 through 8 are various views of intermediate stages in the manufacturing of the semiconductor device structure 10, in accordance with some embodiments. With reference to FIG. 1 for the cross-section defined by the line A-A, FIGS. 2, 3, 4, 6, and 8 illustrate a cross-section along the cross-section A-A. FIGS. 5 and 7 are perspective views.

Figure 2:
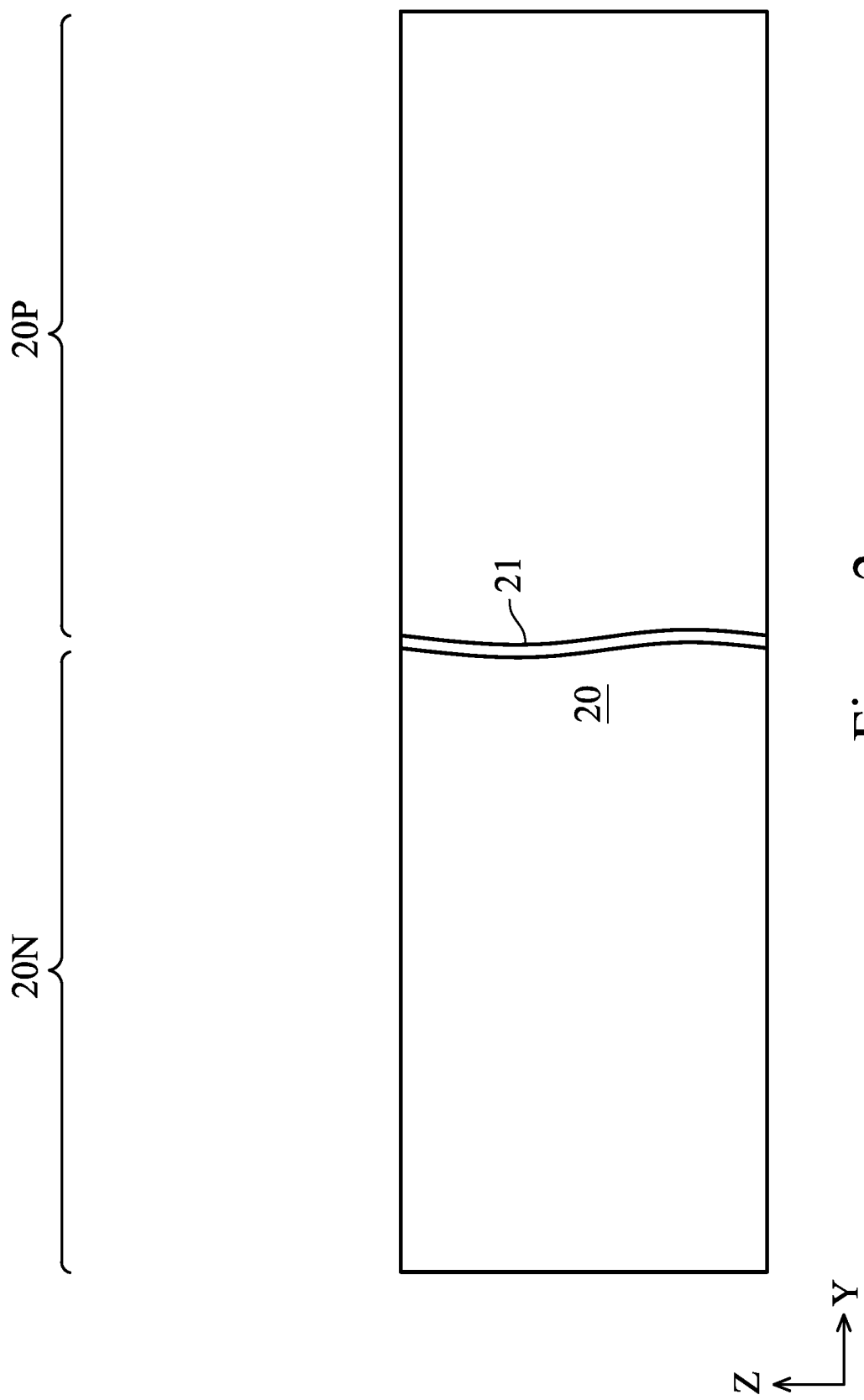

In FIG. 2, a substrate 20 is provided. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 20 has a region 20N and a region 20P. The region 20N can be for forming n-type devices, such as NMOS transistors, e.g., n-type FinFETs. The region 20P can be for forming p-type devices, such as PMOS transistors, e.g., p-type FinFETs. The region 20N may be physically separated from the region 20P (as illustrated by divider 21), and any number of device features (e.g., other active devices, doped regions, isolation structures, etc.) may be disposed between the region 20N and the region 20P.

In FIG. 3, fins 24 are formed in the substrate 20. The fins 24 are semiconductor strips. In some embodiments, the fins 24 may be formed in the substrate 20 by etching trenches in the substrate 20. The etching may be any acceptable etch process, such as a reactive ion etch (RIE), neutral beam etch (NBE), the like, or a combination thereof. The etch may be anisotropic.

The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 24.

In FIG. 4, an insulation material 25 is formed over the substrate 20 and between neighboring fins 24. The insulation material 25 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 25 is silicon oxide formed by a FCVD process. An anneal process may be performed once the insulation material is formed. In an embodiment, the insulation material 25 is formed such that excess insulation material 25 covers the fins 24. Although the insulation material 25 is illustrated as a single layer, some embodiments may utilize multiple layers. For example, in some embodiments a liner (not shown) may first be formed along a surface of the substrate 20 and the fins 24. Thereafter, a fill material, such as those discussed above may be formed over the liner.

FIG. 5 illustrates a perspective view which may be applicable for either region 20N or region 20P. FIG. 6 illustrates a cross-sectional view of the structure shown in FIG. 5, with the cross-sectional view obtained from the plane containing line A-A as illustrated in FIG. 1. In FIGS. 5 and 6, a removal process is applied to the insulation material 25 to remove excess insulation material 25 over the fins 24. In some embodiments, a planarization process such as a chemical mechanical polish (CMP), an etch-back process, combinations thereof, or the like may be utilized. The planarization process exposes the fins 24 such that top surfaces of the fins 24 and the insulation material 25 are level after the planarization process is complete. In embodiments in which a mask remains on the fins 24, the planarization process may expose the mask or remove the mask such that top surfaces of the mask or the fins 24, respectively, and the insulation material 25 are level after the planarization process is complete.

Figure 8:
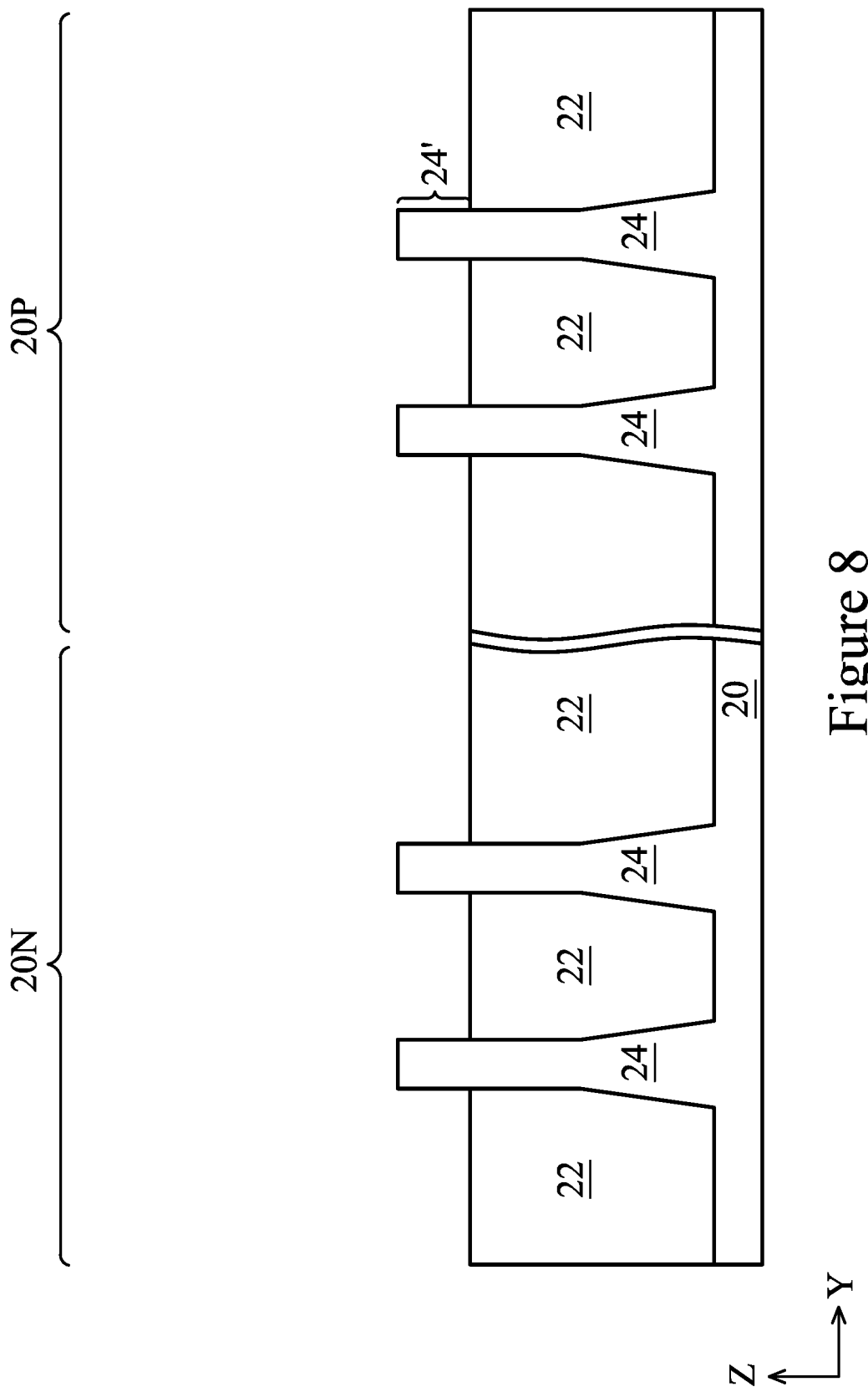

FIG. 7 illustrates a perspective view which may be applicable for either region 20N or region 20P. FIG. 8 illustrates a cross-sectional view of the structure shown in FIG. 7, with the cross-sectional view obtained from the plane containing line A-A as illustrated in FIG. 1. In FIGS. 7 and 8, the insulation material 25 is recessed to form Shallow Trench Isolation (STI) regions (isolation regions 22). The insulation material 25 is recessed such that upper portions (channel region 24') of fins 24 in the region 20N and in the region 20P protrude from between neighboring isolation regions 22. Further, the top surfaces of the isolation regions 22 may have a flat surface as illustrated, a convex surface, a concave surface (such as dishing), or a combination thereof. The top surfaces of the isolation regions 22 may be formed flat, convex, and/or concave by an appropriate etch. The isolation regions 22 may be recessed using an acceptable etching process, such as one that is selective to the material of the insulation material 25 (e.g., etches the material of the insulation material 25 at a faster rate than the material of the fins 24). For example, an oxide removal using, for example, dilute hydrofluoric (dHF) acid may be utilized.

The process described with respect to FIGS. 2 through 8 is just one example of how the fins 24 may be formed. Other processes may be performed to form the fins 24.

FIGS. 9 through 31C illustrate various additional intermediate stages in the manufacturing of semiconductor device structure 10, in accordance with some embodiments. FIGS. 9 through 31C illustrate features in either of the region 20N and the region 20P and each will not be separately illustrated. Differences (if any) in the structures of the region 20N and the region 20P are described in the text accompanying each figure. With reference to FIG. 1 for the cross-sections defined by the lines A-A, B-B, C-C, and D-D, FIGS. 10A, 12A, 15A, 17A, 19A, 21A, 24A, 25A, 26A, 27, 29A, 30A, and 31A illustrate a cross-section along the line A-A. FIGS. 24B, 25B, 26B, 29B, 30B, and 31B illustrate a cross-section along the line B-B. FIGS. 13A, 13B, 24C, 25C, 26C, 29C, 30C, and 31C illustrate a cross-section along the line C-C. FIGS. 10B, 12B, 15B, 17B, 19B, and 21B illustrate a cross-section along the line D-D.

Figure 9:
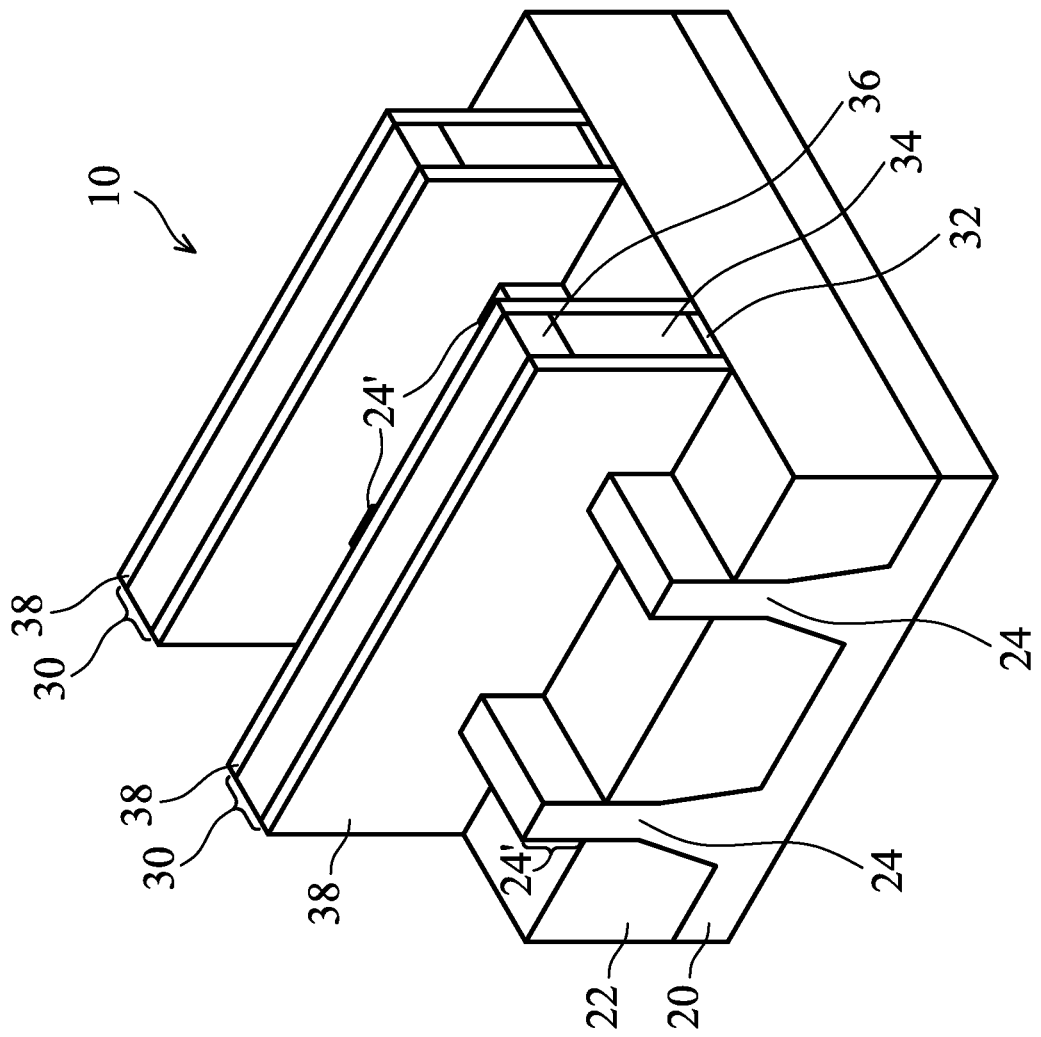
Figure 10B:
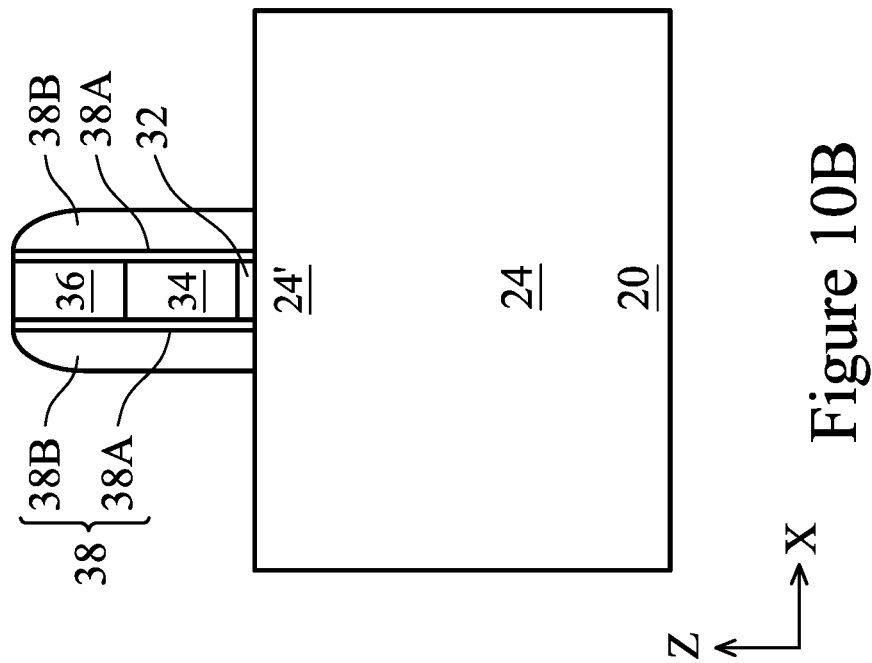
Figure 10A:
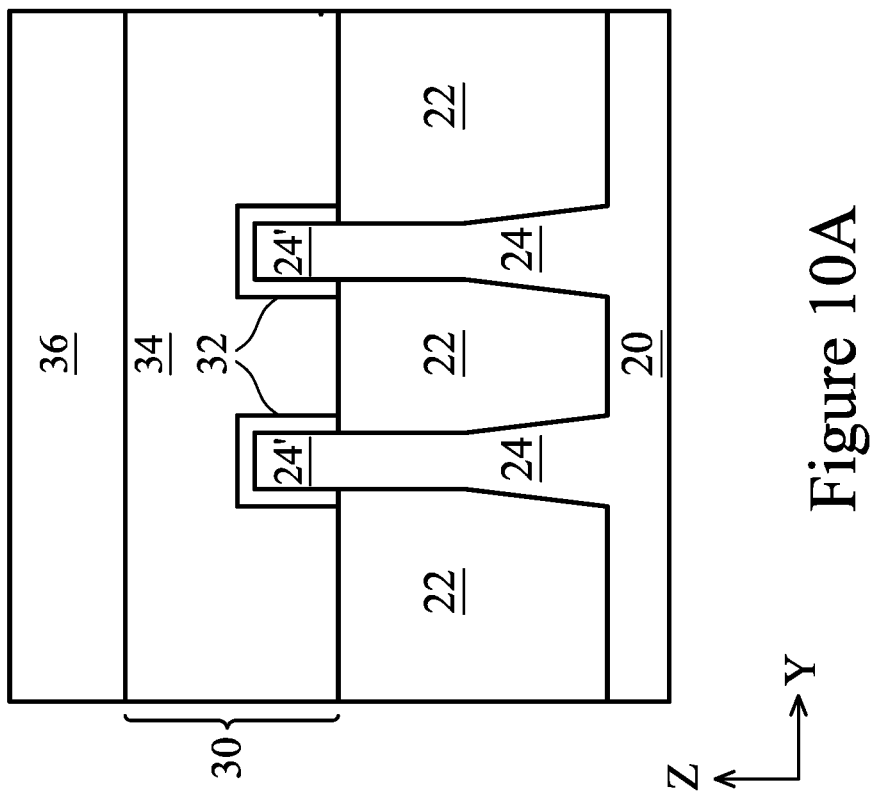

FIG. 10A illustrates a cross-sectional view of the structure shown in FIG. 9, with the cross-sectional view obtained from the plane containing line A-A as illustrated in FIG. 1. FIG. 10B illustrates a cross-sectional view of the structure shown in FIG. 9, with the cross-sectional view obtained from the plane containing line D-D as illustrated in FIG. 1. In FIGS. 9, 10A, and 10B, a dummy dielectric layer is formed on the fins 24. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The mask layer may be patterned using acceptable photolithography and etching techniques to form masks 36. The pattern of the masks 36 then may be transferred to the dummy gate layer to form dummy gate electrodes 34. In some embodiments, the pattern of the masks 36 may also be transferred to the dummy dielectric layer by an acceptable etching technique to form gate dielectric layer 32. Together the gate dielectric layer 32 and dummy gate electrodes 34 form dummy gate stacks 30. The dummy gate stacks 30 cover respective channel regions 24' of the fins 24. The dummy gate stacks 30 may have a lengthwise direction substantially perpendicular to the lengthwise direction of respective epitaxial fins 24.

The dummy gate electrodes 34 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate electrodes 34 formed from the dummy gate layer may be deposited by physical vapor deposition (PVD), CVD, sputter deposition, or other techniques known and used in the art for depositing the selected material. It is noted that the gate dielectric layer 32 is shown covering only the fins 24 for illustrative purposes only.

Also in FIGS. 9, 10A, and 10B, gate seal spacers 38A can be formed on exposed surfaces of the dummy gates stacks 30, the masks 36, and/or the fins 24 (the channel regions 24'). A thermal oxidation or a deposition followed by an anisotropic etch may form the gate seal spacers 38A. The gate seal spacers 38A may be formed of silicon oxide, silicon nitride, silicon oxynitride, or the like. After the formation of the gate seal spacers 38A, implants for lightly doped source/drain (LDD) regions (not explicitly illustrated) may be performed. In the embodiments with different device types, similar to the implants discussed above with respect to FIGS. 7 and 8, a mask, such as a photoresist, may be formed over the region 20N, while exposing the region 20P, and appropriate type (e.g., p-type) impurities may be implanted into the exposed channel regions 24' in the region 20P. The mask may then be removed. Subsequently, a mask, such as a photoresist, may be formed over the region 20P while exposing the region 20N, and appropriate type impurities (e.g., n-type) may be implanted into the exposed channel regions 24' in the region 20N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal process may be performed to repair implant damage and to activate the implanted impurities.

Also in FIGS. 9, 10A, and 10B, gate spacers 38B are formed on the gate seal spacers 38A along sidewalls of the dummy gates stacks 30 and the masks 36. The gate spacers 38B may be formed by conformally depositing an insulating material and subsequently anisotropically etching the insulating material. The insulating material of the gate spacers 38B may be silicon oxide, silicon nitride, silicon oxynitride, silicon carbonitride, a combination thereof, or the like.

The gate seal spacers 38A and gate spacers 38B may, for simplicity, together be referred to as gate spacers 38. It is noted that the above disclosure generally describes a process of forming spacers and LDD regions. Other processes and sequences may be used.

Figure 11:
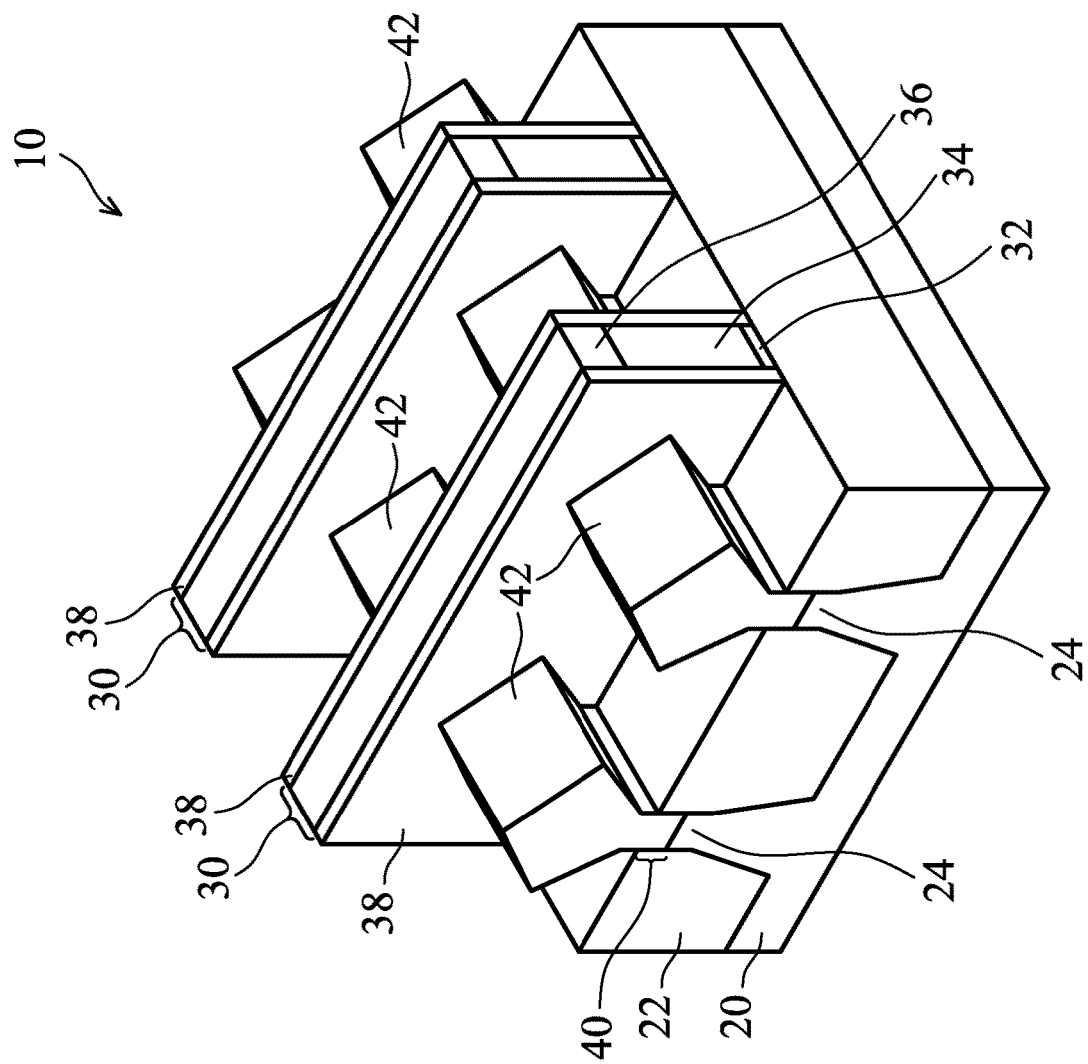
Figure 12B:
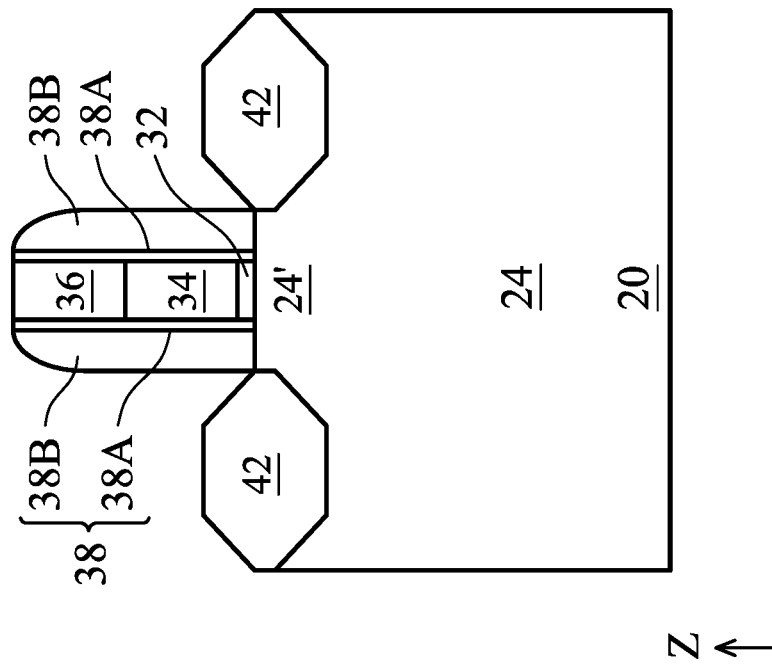
Figure 12A:
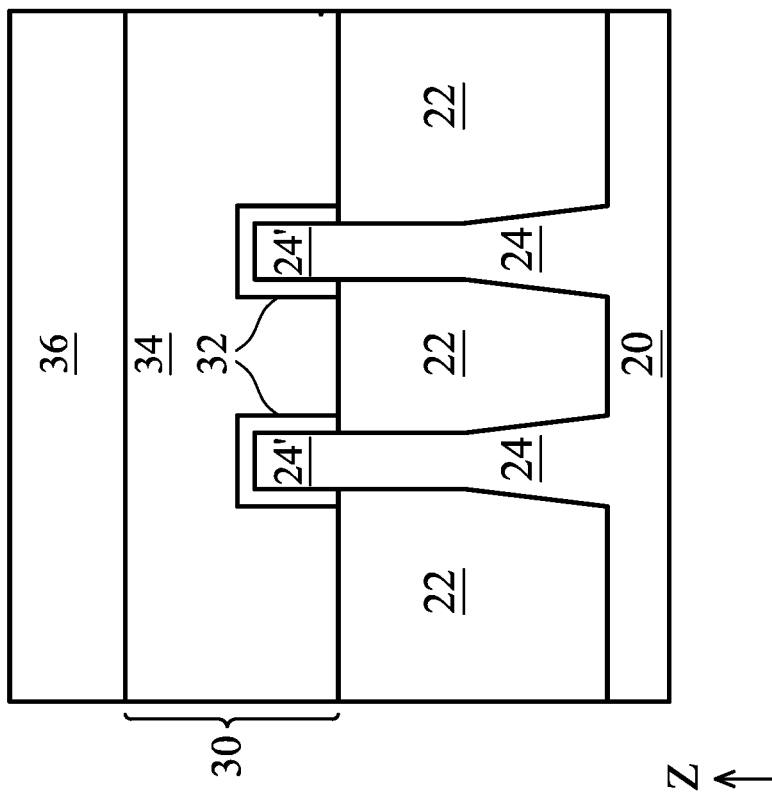
Figure 13B:
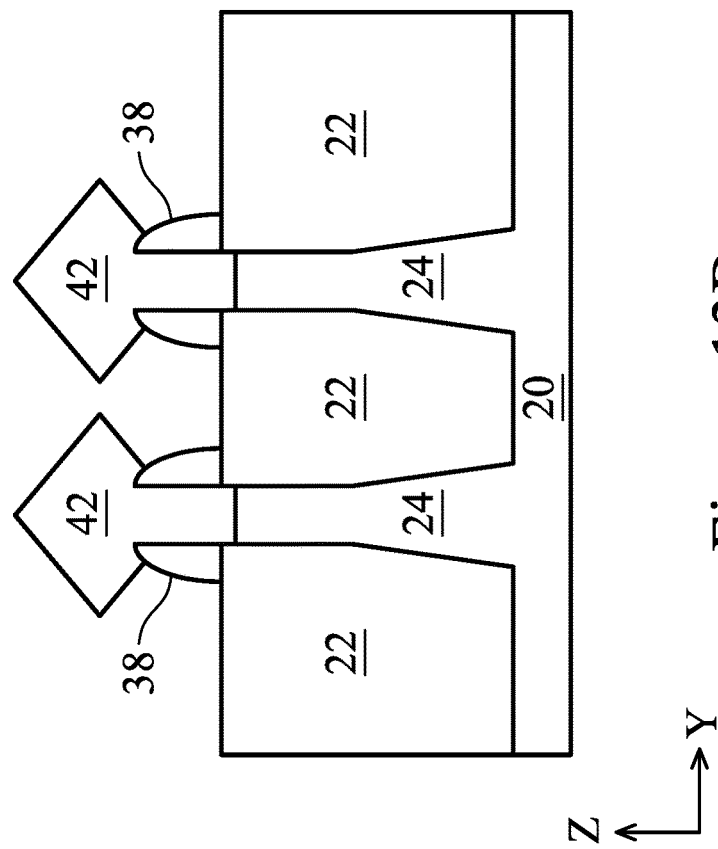
Figure 13A:
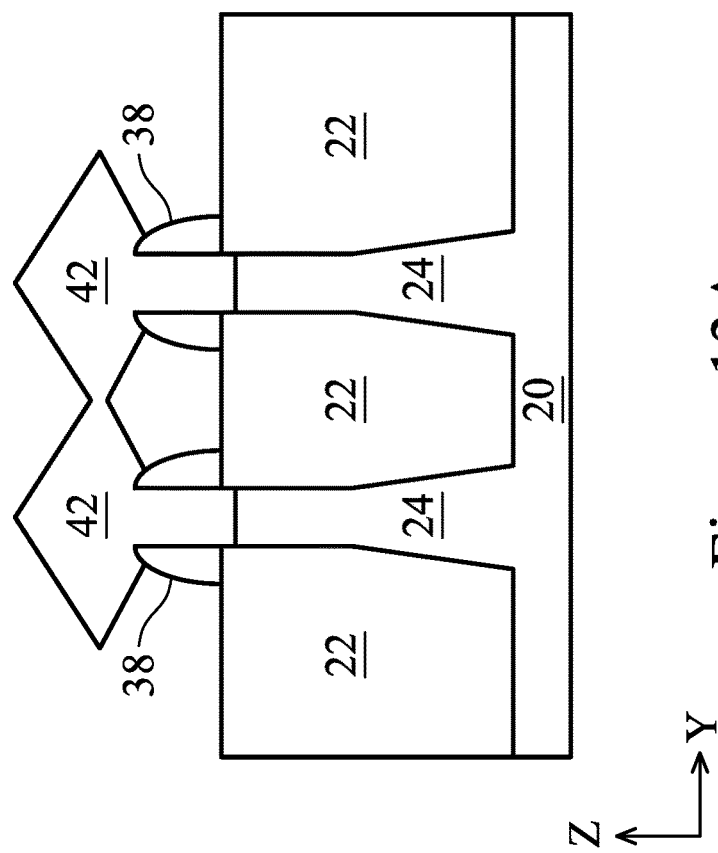

FIG. 12A illustrates a cross-sectional view of the structure shown in FIG. 11, with the cross-sectional view obtained from the plane containing line A-A as illustrated in FIG. 1. FIG. 12B illustrates a cross-sectional view of the structure shown in FIG. 11, with the cross-sectional view obtained from the plane containing line D-D as illustrated in FIG. 1. FIGS. 13A and 13B illustrate cross-sectional views of the structure shown in FIG. 11 obtained from the plane containing line C-C as illustrated in FIG. 1. In FIGS. 11, 12A, 12B, 13A, and 13B, epitaxial source/drain regions 42 are formed in the fins 24 to exert stress in the respective channel regions 24', thereby improving performance. The epitaxial source/drain regions 42 are formed in the fins 24 such that each dummy gate stack 30 is disposed between respective neighboring pairs of the epitaxial source/drain regions 42. In some embodiments the epitaxial source/drain regions 42 may extend into, and may also penetrate through, the fins 24. In some embodiments, the gate spacers 38 are used to separate the epitaxial source/drain regions 42 from the dummy gate stacks 30 by an appropriate lateral distance so that the epitaxial source/drain regions 42 do not short out subsequently formed gates of the resulting FinFETs.

The epitaxial source/drain regions 42 in the region 20N, e.g., the NMOS region, may be formed by masking the region 20P, e.g., the PMOS region, and source/drain regions of the fins 24 in the region 20N are etched to form recesses in the fins 24. Then, the epitaxial source/drain regions 42 in the region 20N are epitaxially grown in the recesses. The epitaxial source/drain regions 42 may include any acceptable material, such as appropriate for n-type FinFETs. For example, if the fin 24 is silicon, the epitaxial source/drain regions 42 in the region 20N may include materials exerting a tensile strain in the channel region 24', such as silicon, silicon carbide, phosphorous doped silicon carbide, silicon phosphide, or the like. The epitaxial source/drain regions 42 in the region 20N may have surfaces raised from respective surfaces of the fins 24 and may have facets.

The epitaxial source/drain regions 42 in the region 20P, e.g., the PMOS region, may be formed by masking the region 20N, e.g., the NMOS region, and source/drain regions of the fins 24 in the region 20P are etched to form recesses in the fins 24. Then, the epitaxial source/drain regions 42 in the region 20P are epitaxially grown in the recesses. The epitaxial source/drain regions 42 may include any acceptable material, such as appropriate for p-type FinFETs. For example, if the fin 24 is silicon, the epitaxial source/drain regions 42 in the region 20P may include materials exerting a compressive strain in the channel region 24', such as silicon-germanium, boron doped silicon-germanium, germanium, germanium tin, or the like. The epitaxial source/drain regions 42 in the region 20P may also have surfaces raised from respective surfaces of the fins 24 and may have facets.

The epitaxial source/drain regions 42 and/or the fins 24 may be implanted with dopants to form source/drain regions, similar to the process previously discussed for forming lightly-doped source/drain regions, followed by an anneal process. The epitaxial source/drain regions 42 may have an impurity concentration of between about $10^{19}$ cm$^{-3}$ and about $10^{21}$ cm$^{-3}$. The n-type and/or p-type impurities for epitaxial source/drain regions 42 may be any of the impurities previously discussed. In some embodiments, the epitaxial source/drain regions 42 may be in situ doped during growth.

As a result of the epitaxy processes used to form the epitaxial source/drain regions 42 in the region 20N and the region 20P, upper surfaces of the epitaxial source/drain regions have facets which expand laterally outward beyond sidewalls of the fins 24. In some embodiments, these facets cause adjacent epitaxial source/drain regions 42 of a same FinFET to merge as illustrated by FIG. 13A. In other embodiments, adjacent epitaxial source/drain regions 42 remain separated after the epitaxy process is completed as illustrated by FIG. 13B. In the embodiments illustrated in FIGS. 13A and 13B, gate spacers 38 are formed covering a portion of the sidewalls of the fins 24 (the channel region 24') that extend above the STI regions 22 thereby blocking the epitaxial growth. In some other embodiments, the spacer etch used to form the gate spacers 38 may be adjusted to remove the spacer material to allow the epitaxially source/drain regions 42 to extend to the surface of the isolation regions 22.

Figure 14:
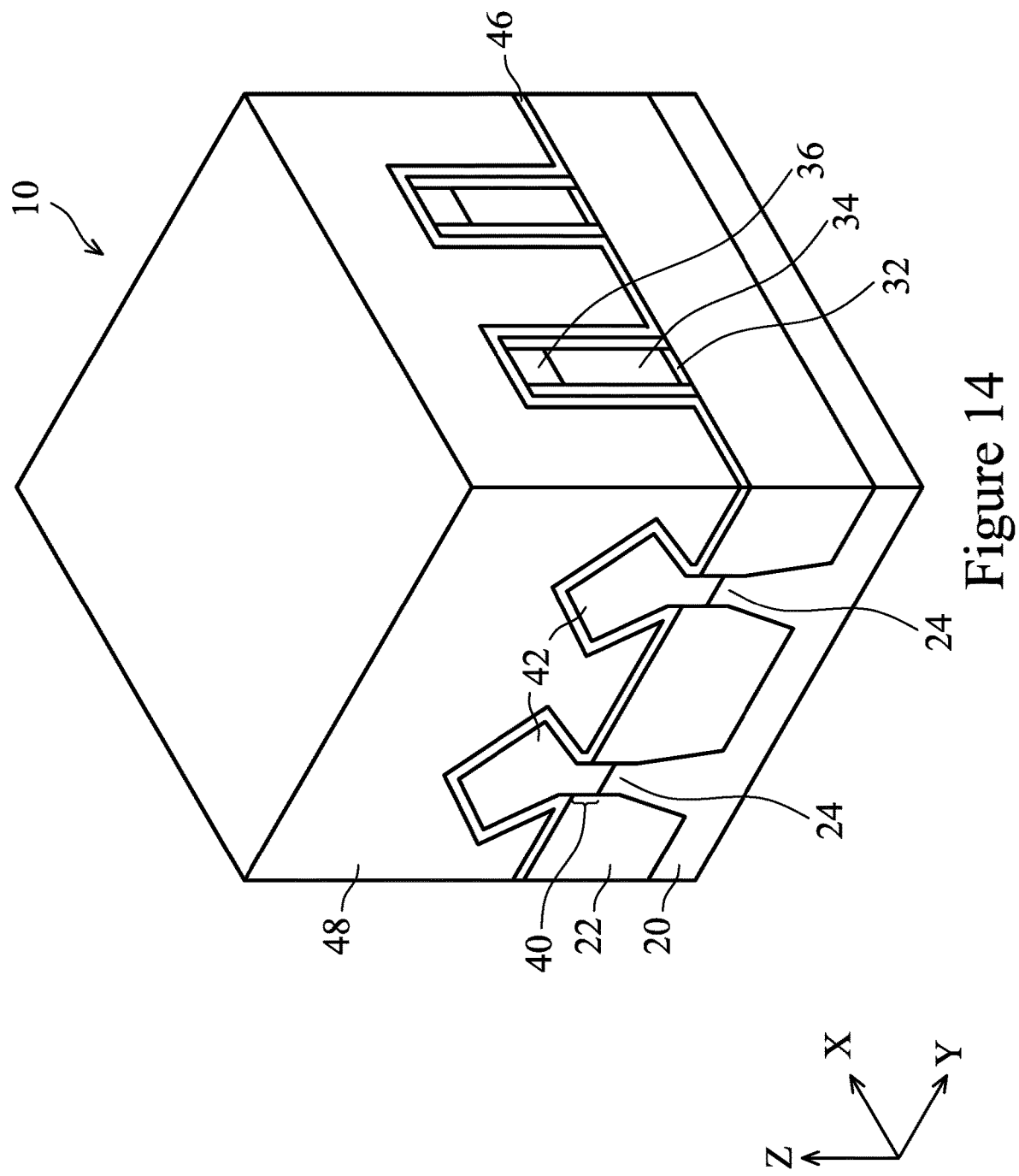
Figure 15B:
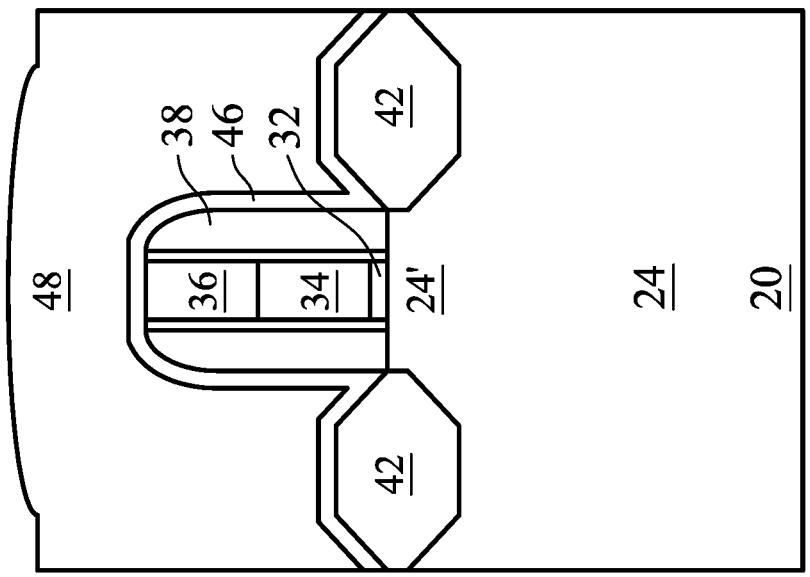
Figure 15A:
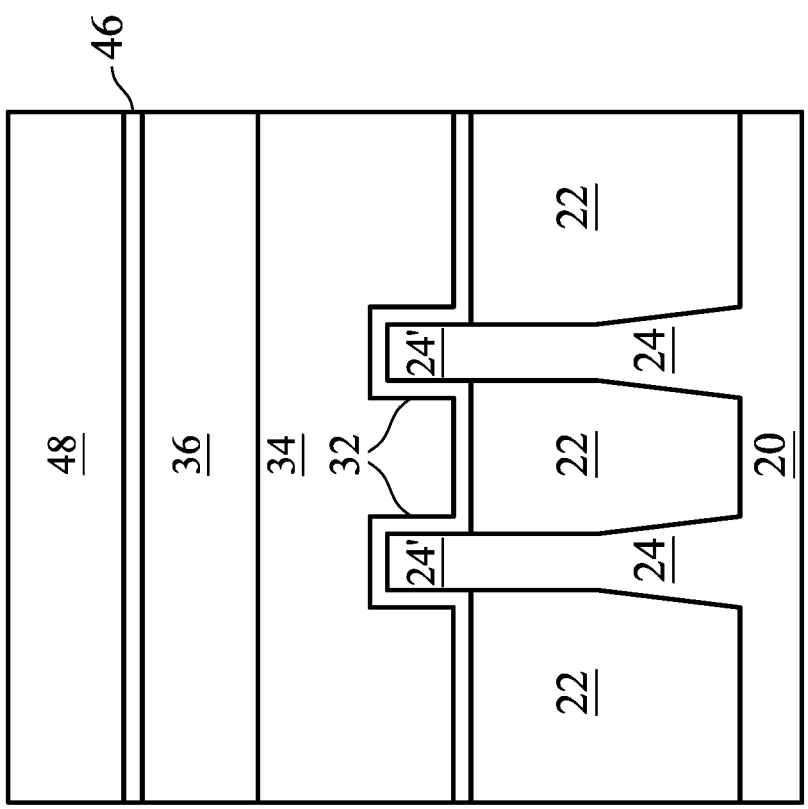

FIG. 15A illustrates a cross-sectional view of the structure shown in FIG. 14, with the cross-sectional view obtained from the plane containing line A-A as illustrated in FIG. 1. FIG. 15B illustrates a cross-sectional view of the structure shown in FIG. 14, with the cross-sectional view obtained from the plane containing line D-D as illustrated in FIG. 1. In FIGS. 14, 15A, and 15B, a first interlayer dielectric (ILD) 48 is deposited over the semiconductor device structure 10 illustrated in FIGS. 11, 12A, and 12B. The first ILD 48 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the first ILD 48 and the epitaxial source/drain regions 42, the masks 36, and the gate spacers 38. The CESL 46 may include a dielectric material, such as, silicon nitride, silicon oxide, silicon oxynitride, or the like, having a different etch rate than the material of the first ILD 48.

Figure 16:
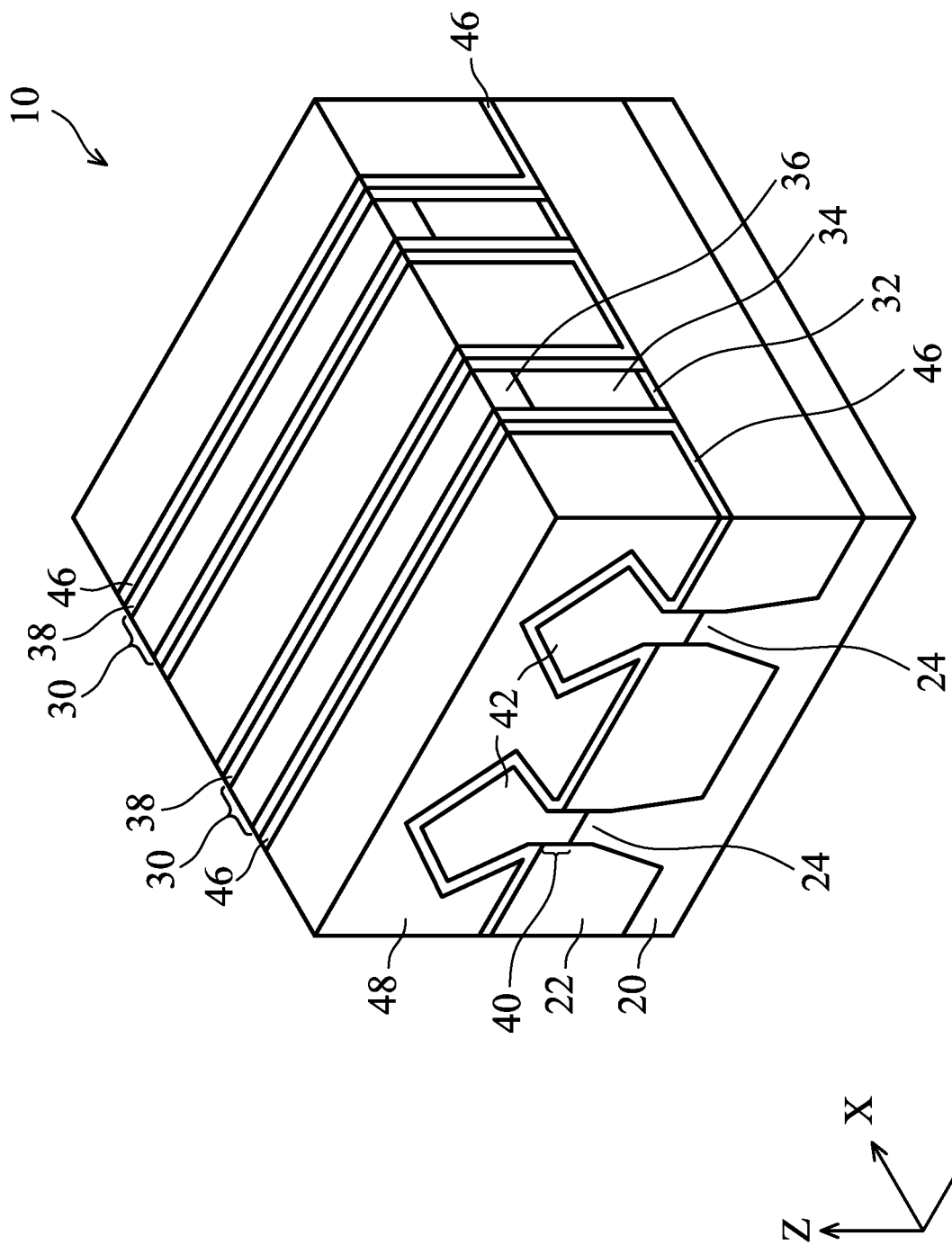
Figure 17B:
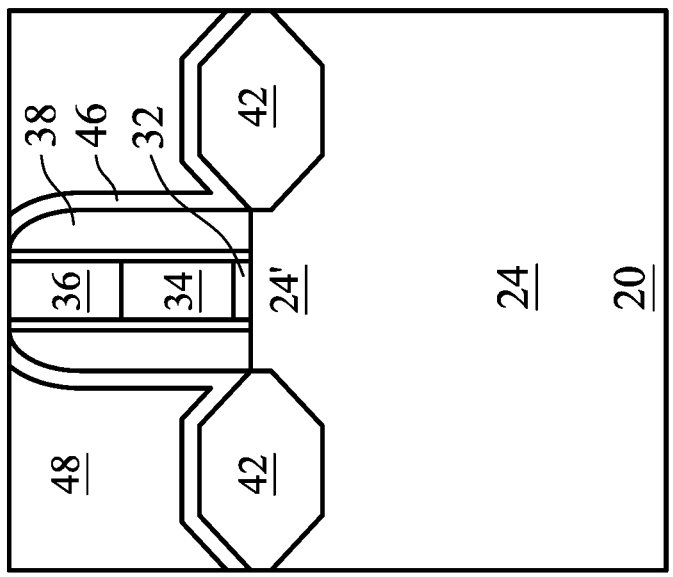
Figure 17A:
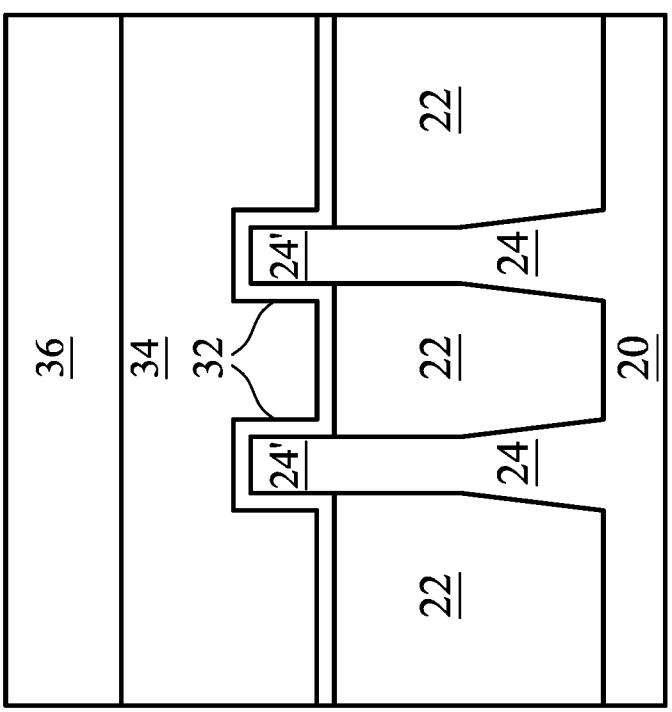

FIG. 17A illustrates a cross-sectional view of the structure shown in FIG. 16, with the cross-sectional view obtained from the plane containing line A-A as illustrated in FIG. 1. FIG. 17B illustrates a cross-sectional view of the structure shown in FIG. 16, with the cross-sectional view obtained from the plane containing line D-D as illustrated in FIG. 1. In FIGS. 16, 17A, and 17B, a planarization process, such as a CMP, may be performed to level the top surface of the first ILD 48 with the top surfaces of the dummy gate stacks 30 or the masks 36 (as shown, for example, in FIG. 17B). The planarization process may also remove the masks 36 (or a portion thereof) on the dummy gate stacks 30, and portions of the gate spacers 38 along sidewalls of the masks 36. After the planarization process, the masks 36 may remain, in which case top surfaces of the masks 36, top surfaces of the gate spacers 38, and the top surface of the first ILD 48 are leveled with each other. In some embodiments, top surfaces of the dummy gate stacks 30, the gate spacers 38, and the first ILD 48 are levelled as a result of the planarization process. In such embodiments, the top surfaces of the dummy gates 72 are exposed through the first ILD 48.

Figure 18:
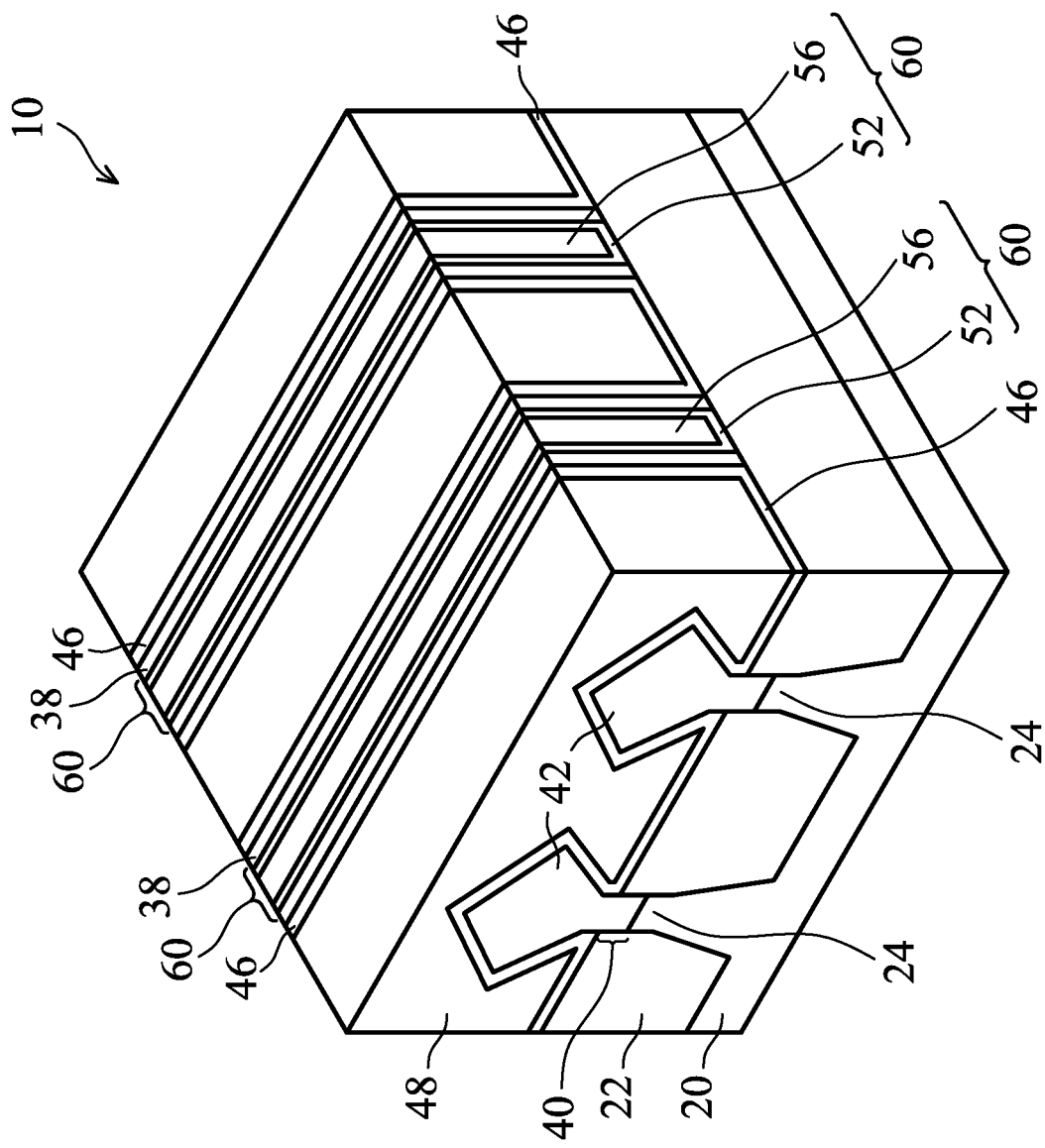

FIG. 19A illustrates a cross-sectional view of the structure shown in FIG. 18, with the cross-sectional view obtained from the plane containing line A-A as illustrated in FIG. 1. FIG. 19B illustrates a cross-sectional view of the structure shown in FIG. 18, with the cross-sectional view obtained from the plane containing line D-D as illustrated in FIG. 1. FIGS. 18, 19A, and 19B illustrate a gate replacement process. The dummy gate electrodes 34, the masks 36 if present, and optionally the gate dielectric layer 32, are removed by one or more etching processes and replaced with replacement gates. In some embodiments, the masks 36, if present, and dummy gate electrodes 34 are removed by an anisotropic dry etch process. During the removal, the gate dielectric layer 32 may be used as an etch stop layer when the dummy gate electrodes 34 are etched. The gate dielectric layer 32 may then be optionally removed after the removal of the dummy gate electrodes 34.

Next, gate dielectric layers 52 and gate electrodes 56 are formed. The gate dielectric layers 52 are deposited conformally in the recesses, such as on the top surfaces and the sidewalls of the fins 24 and on sidewalls of the gate spacers 38. The gate dielectric layers 52 may also be formed on the top surface of the first ILD 48. In accordance with some embodiments, the gate dielectric layers 52 includes silicon oxide, silicon nitride, or multilayers thereof. In some embodiments, the gate dielectric layers 52 may include a high-k dielectric material, and in these embodiments, the gate dielectric layers 52 may have a k value greater than about 7.0 and may include a metal oxide or a silicate of hafnium, aluminum, zirconium, lanthanum, manganese, barium, titanium, lead, and combinations thereof. The gate dielectric layers 52 may be formed by Molecular-Beam Deposition (MBD), atomic layer deposition (ALD), PECVD, and the like.

The gate electrodes 56 are deposited over the gate dielectric layers 52 and fill the remaining portions of the recesses. The gate electrodes 56 may include a metal-containing material such as titanium nitride, titanium oxide, tantalum nitride, tantalum carbide, cobalt, ruthenium, aluminum, tungsten, combinations thereof, or multi-layers thereof. For example, although the gate electrode 56 is illustrated in FIG. 19B as having a single layer, the gate electrode 56 may include any number of liner layers, any number of work function tuning layers, and a fill material, all together illustrated as gate electrode 56. In some embodiments, as shown in FIG. 19B-1, the gate electrode 56 includes one or more work function tuning layers 55 and a fill material 57. The work function tuning layer 55 may include an electrically conductive material, such as a metal nitride, for example TiN or TaN. The fill material 57 may include an electrically conductive material, such as a metal. After the filling of the recesses, a planarization process, such as a CMP, may be performed to remove the excess portions of the gate dielectric layers 52 and excess portions of the gate electrodes 56 over the top surface of the first ILD 48. The remaining portions of the gate dielectric layers 52 and the gate electrodes 56 thus form replacement gates of the resulting FinFETs. The gate electrodes 56 and the gate dielectric layers 52 of the replacement gates may be collectively referred to as gate stack 60.

The formation of the gate dielectric layers 52 in the region 20N and the region 20P may occur simultaneously such that the gate dielectric layers 52 in each region are formed from the same materials, and the formation of the gate electrodes 56 may occur simultaneously such that the gate electrodes 56 in each region are formed from the same materials. In some embodiments, the gate dielectric layers 52 in each region may be formed by distinct processes, such that the gate dielectric layers 52 may be different materials, and/or the gate electrodes 56 in each region may be formed by distinct processes, such that the gate electrodes 56 may be different materials. Various masking steps may be used to mask and expose appropriate regions when using distinct processes.

Figure 20:
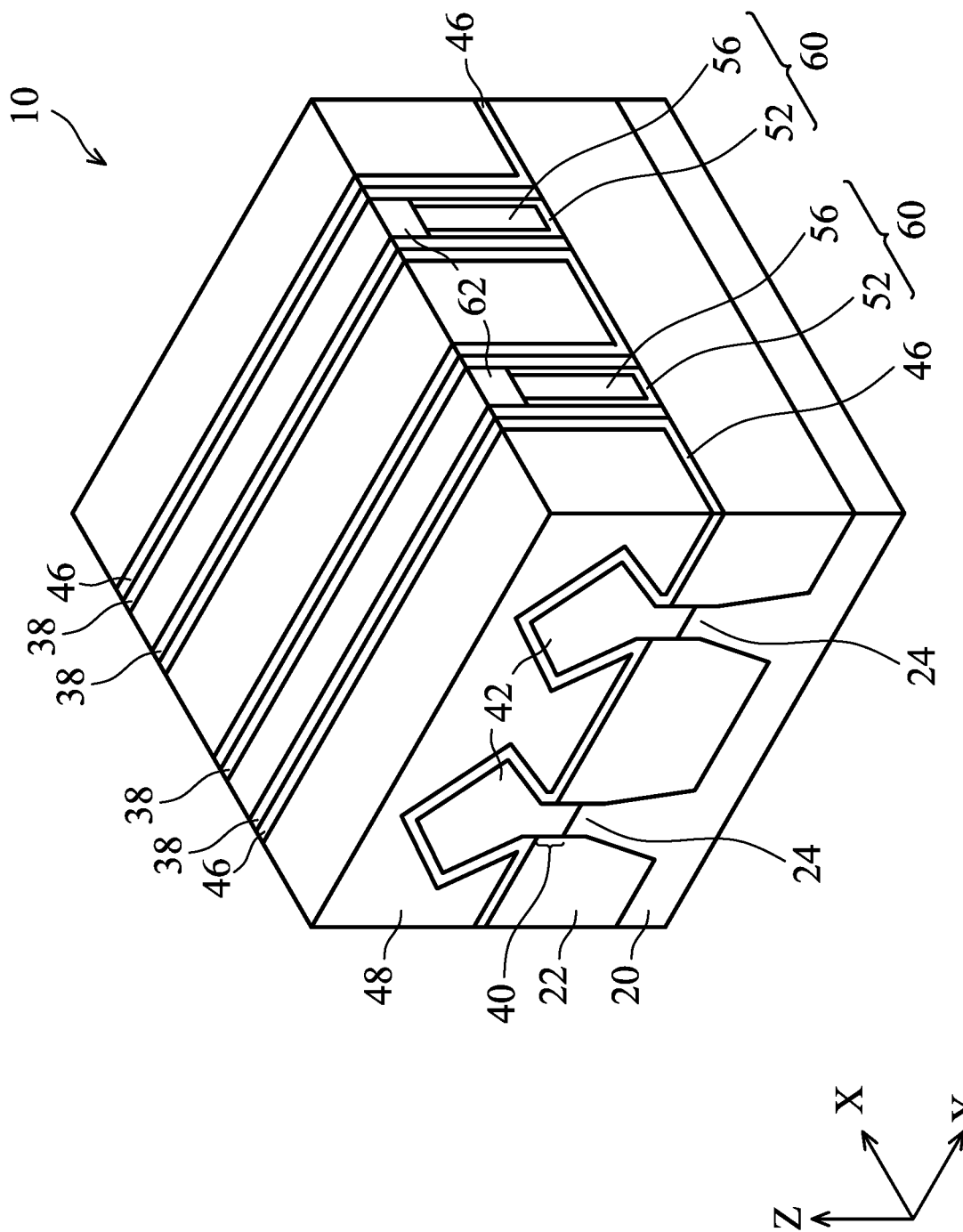
Figure 21B:
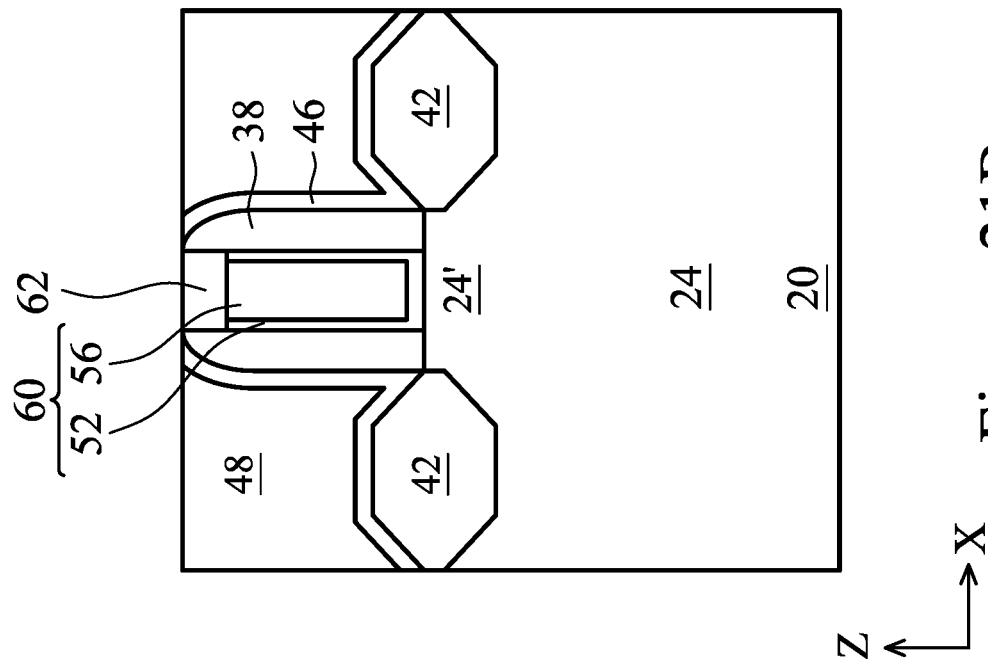
Figure 21A:
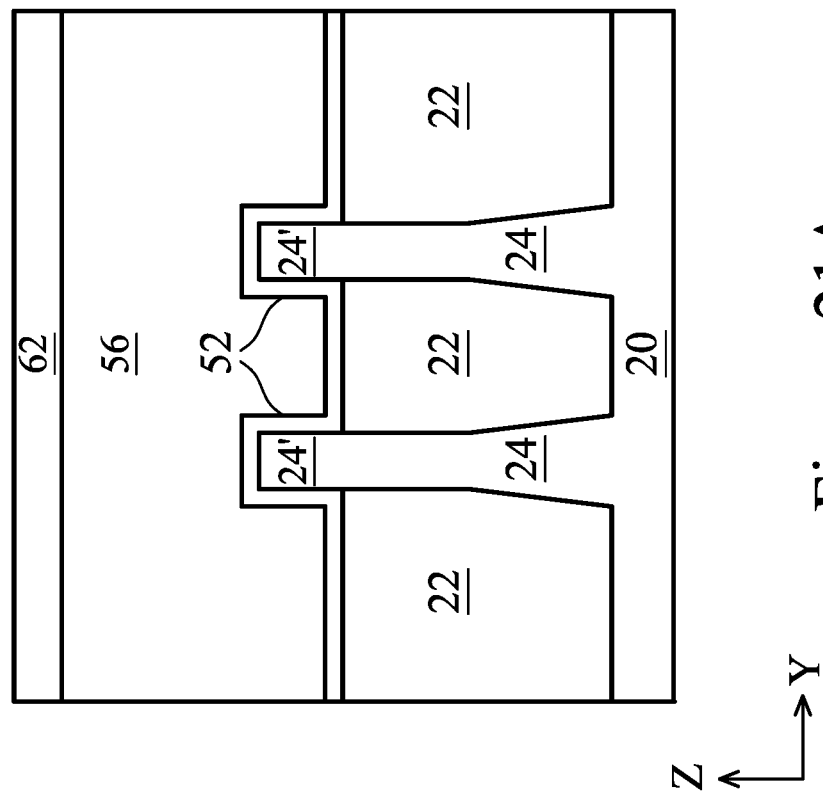

FIG. 21A illustrates a cross-sectional view of the structure shown in FIG. 20, with the cross-sectional view obtained from the plane containing line A-A as illustrated in FIG. 1. FIG. 21B illustrates a cross-sectional view of the structure shown in FIG. 20, with the cross-sectional view obtained from the plane containing line D-D as illustrated in FIG. 1. As shown in FIGS. 20, 21A, and 21B, hard masks 62 are formed. The material of hard masks 62 may be the same as or different from the materials of the CESL 46, the first ILD 48, and/or gate spacers 38. In some embodiments, the hard masks 62 are formed of silicon nitride, silicon oxynitride, silicon oxy-carbide, silicon oxy carbo-nitride, or the like. The formation of the hard masks 62 may include recessing the gate stacks 60 to form recesses, filling a dielectric material into the recesses, and performing a planarization to remove the excess portions of the dielectric material. The remaining portions of the dielectric material in the recesses are the hard masks 62.

Figure 22:
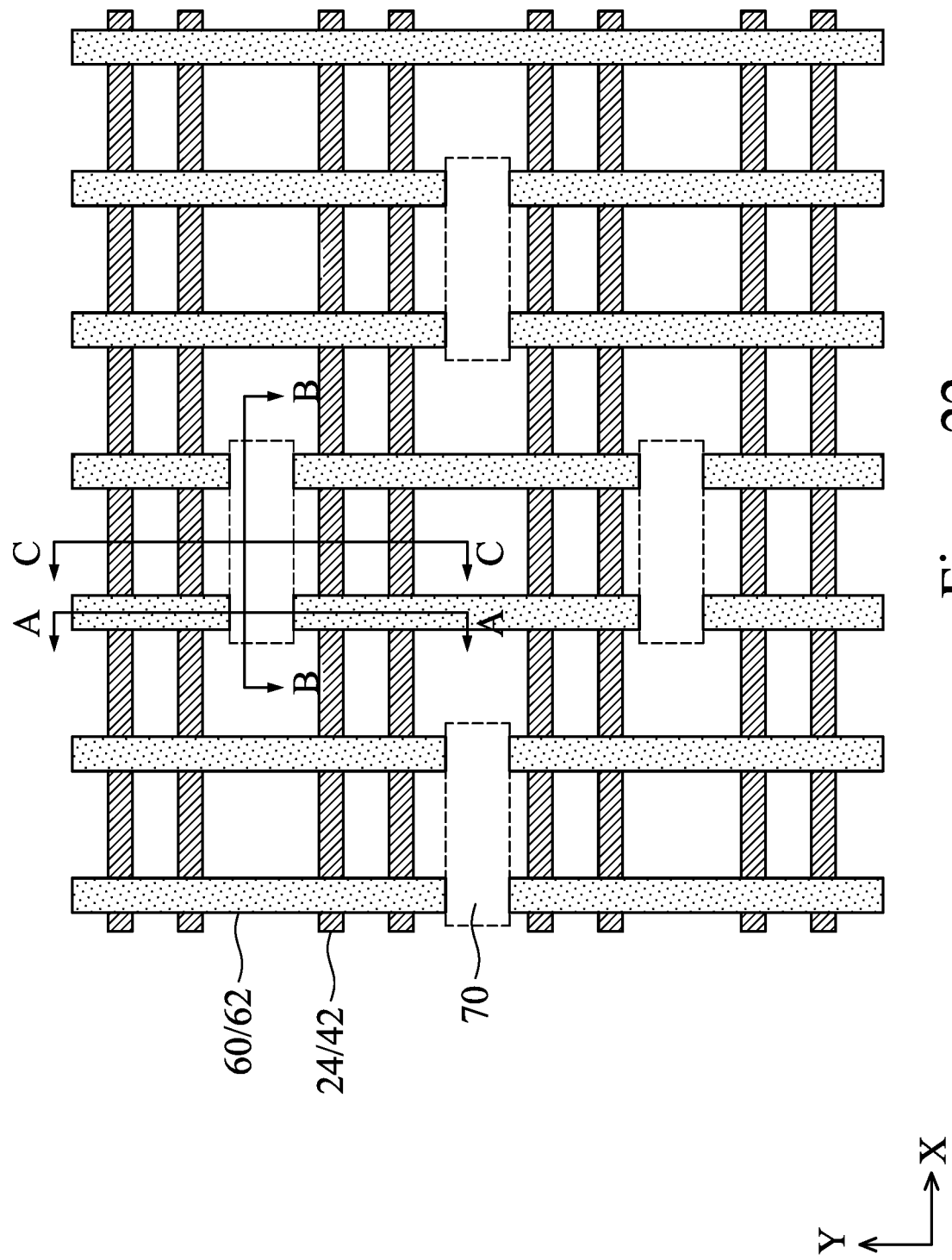

FIG. 22 illustrates a top-down view of an example portion of a layout of FinFETs, in accordance with some embodiments. In this view, the ILD 48 is not shown so as to illustrate the gate stacks 60 with hard masks 62 and the fins 24 with the source/drain regions 42 more clearly. The vertical lines correspond to the gate stacks 60 with the hard masks 62 formed thereon. The horizontal lines correspond to the fins 24 with the source/drain regions 42 formed therein. The dashed areas correspond to openings 70 which are areas where one or more gates are cut. In the example embodiment below two gates are simultaneously cut in one opening 70, however, in some embodiments, multiple openings 70 may be made which each cut any number of gates, such as only one gate or multiple gates. Other values may be used. The lines A-A, B-B, and C-C correspond to the lines in FIG. 1, each one representing a cross-sectional view obtained from the plane containing each respective line.

FIGS. 22, 23, 24A, 24B, 24C, 25A, 25B, 25C, 26A, 26B, 26C, 27, 29A, 29B, 29C, 30A, 30B, 30C, 31A, 31B, and 31C illustrate a cut-metal gate process followed by a process for forming contacts. The figure numbers of the subsequent processes may include the letter "A," "B," or "C." Unless specified otherwise, the figures whose numbers having the letter "A" are obtained from the vertical plane same as the vertical plane containing line A-A in FIG. 1. The figures whose numbers having the letter "B" are obtained from the vertical plane same as the vertical plane containing line B-B in FIG. 1. The figures whose numbers having the letter "C" are obtained from the vertical plane same as the vertical plane containing line C-C in FIG. 1.

Figure 23:
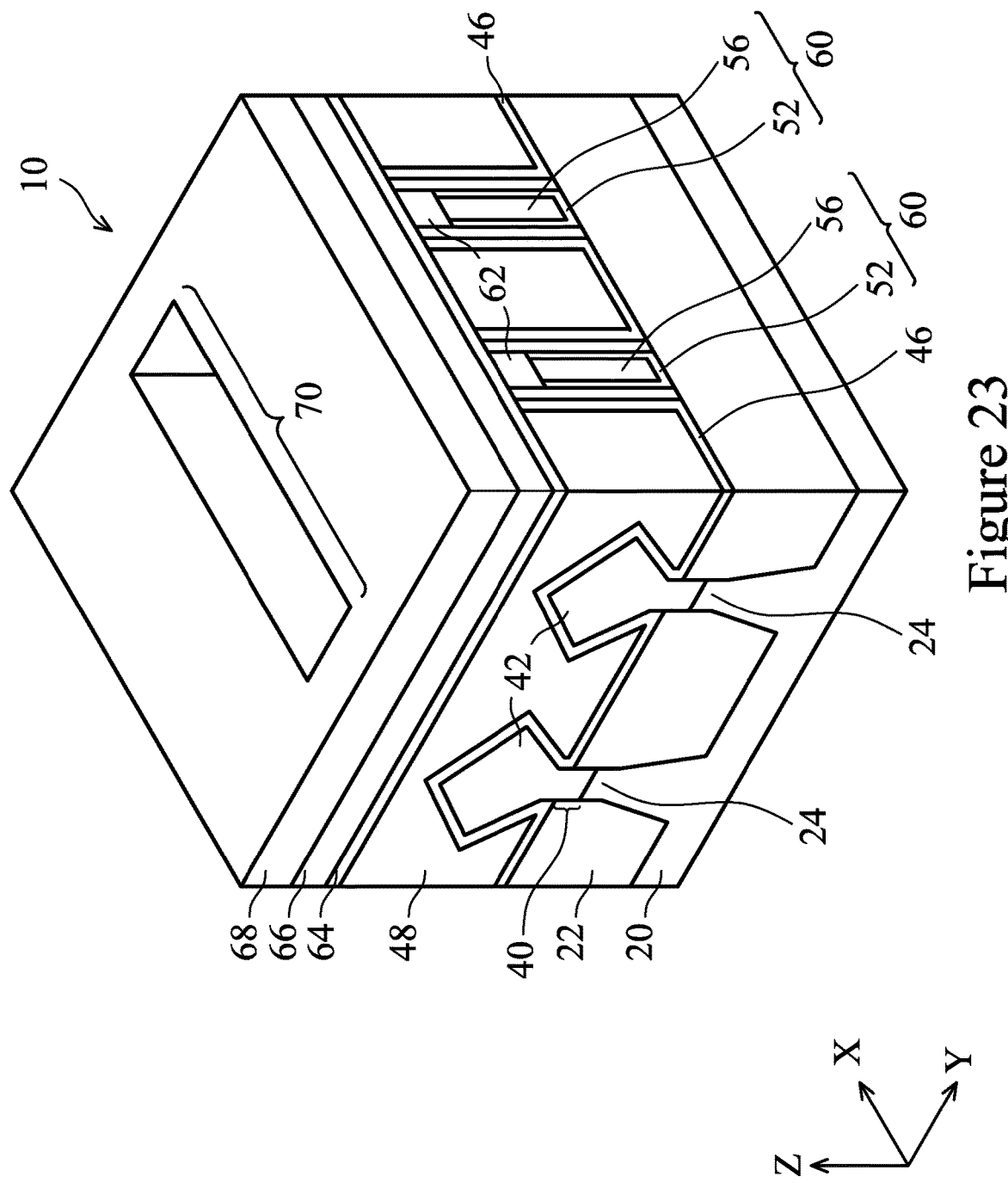
Figure 24A:
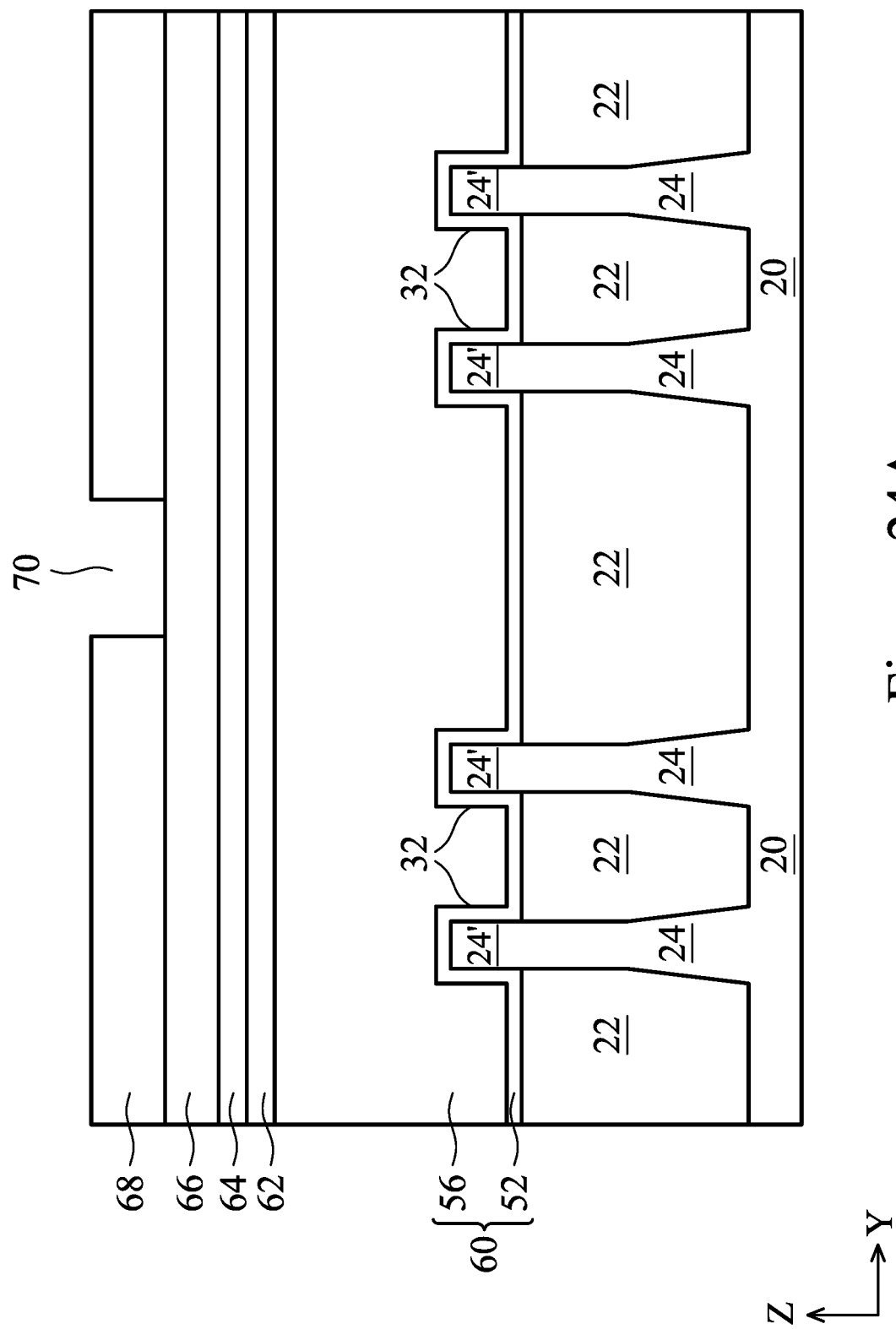
Figure 24B:
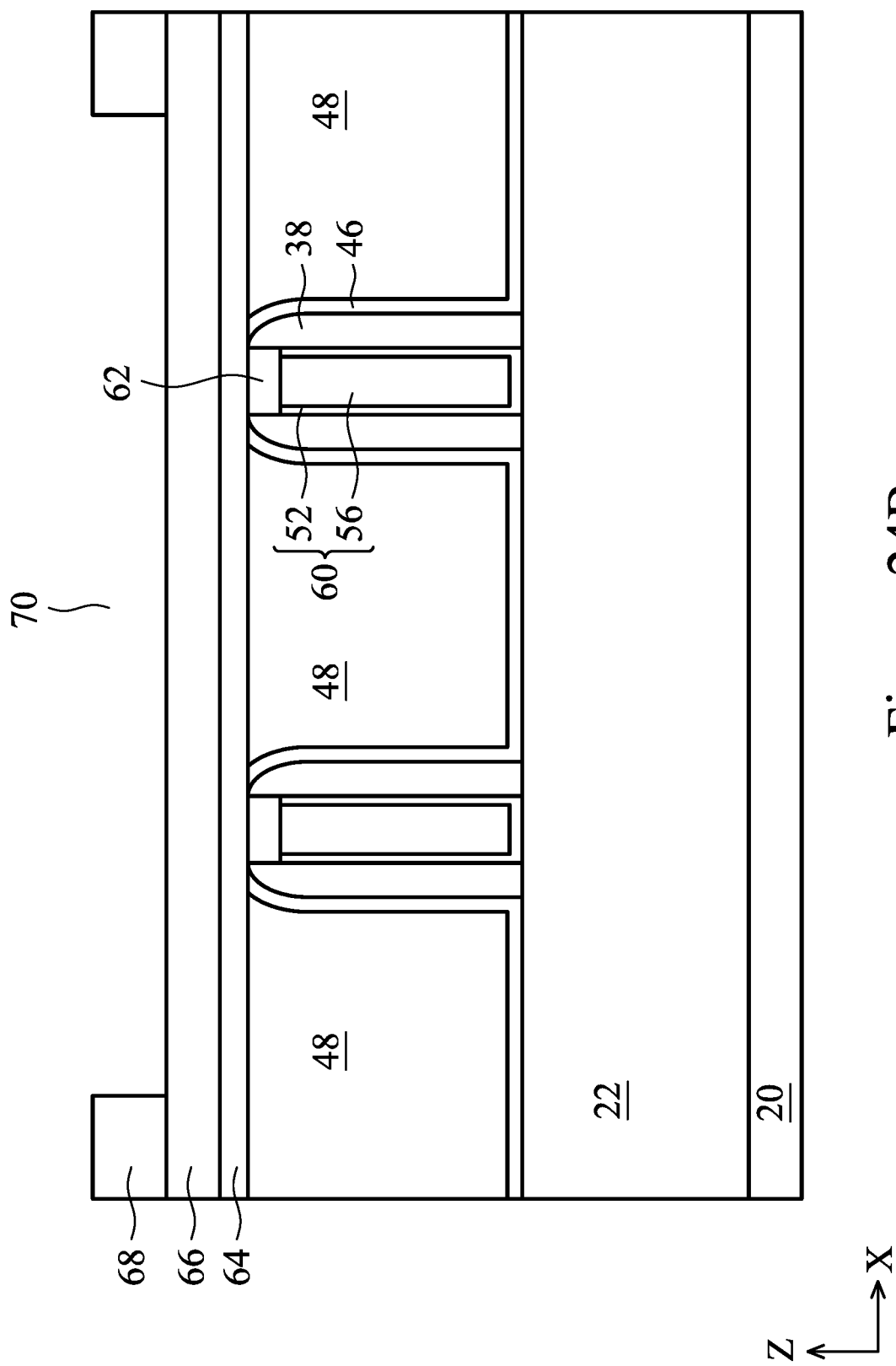
Figure 24C:
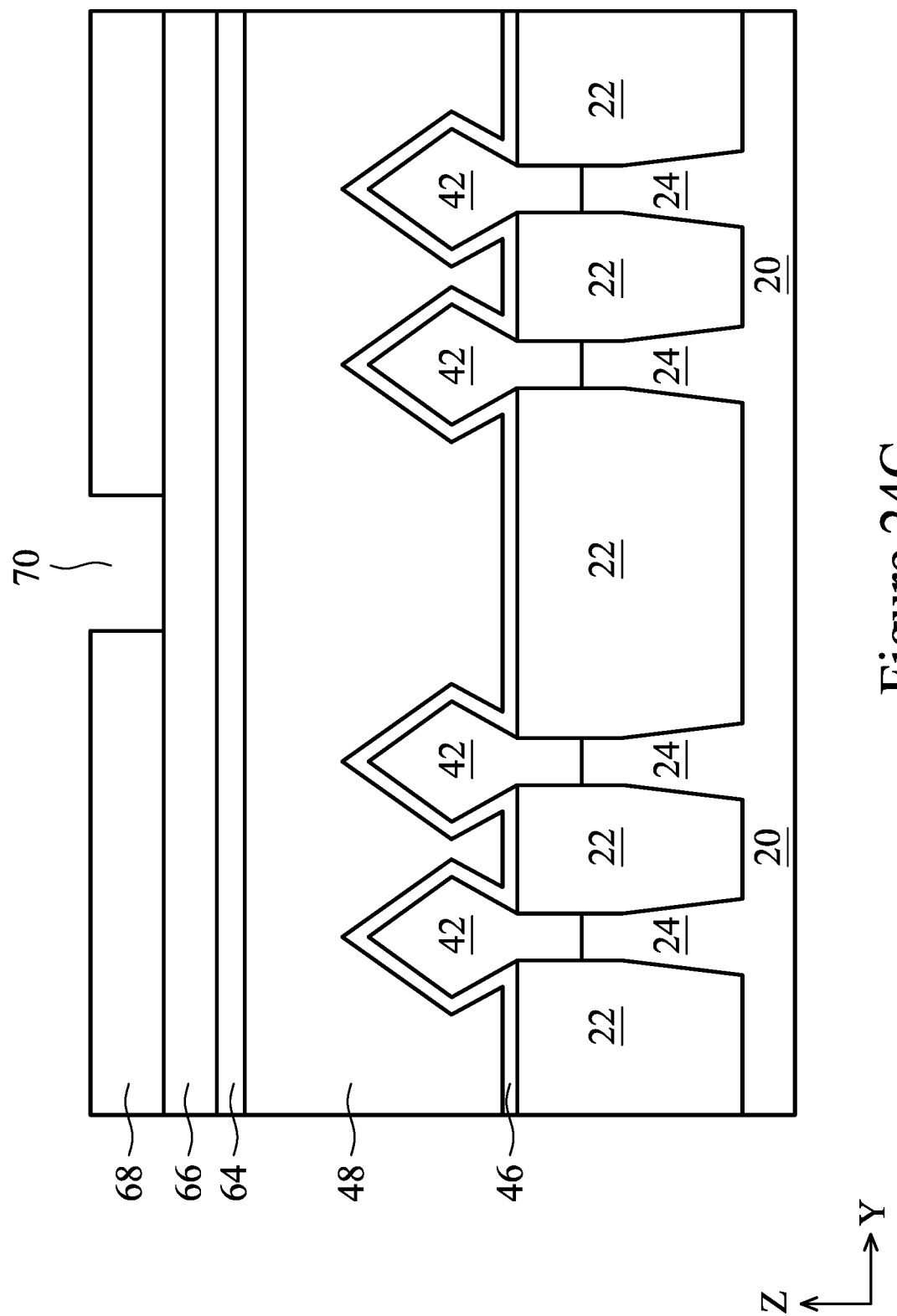

FIGS. 23, 24A, 24B, and 24C illustrate the formation of a pad layer 64, a hard mask layer 66, and a patterned photo resist 68. A Bottom Anti-Reflective Coating (BARC, not shown) may also be formed between hard mask layer 66 and the patterned photo resist 68. In some embodiments, the pad layer 64 is formed of a metal-containing material such as TiN, TaN, or the like. The pad layer 64 may also be formed of a dielectric material such as silicon oxide. The hard mask layer 66 may be formed of SiN, SiON, SiCN, SiOCN, or the like. The formation of the hard mask layer 66 may include ALD, PECVD, or the like. The patterned photo resist 68 is formed over hard mask layer 66, and an opening 70 is formed in the patterned photo resist 68. The opening 70 has a lengthwise direction (viewed from top) perpendicular to the lengthwise direction of the gate stack 60, and a portion of gate stack 60 is directly underlying a portion of opening 70, as illustrated in FIGS. 22, 23A, and 23B. The opening 70 may also extend to some portions of the first ILD 48, as shown in FIGS. 23, 24B, and 24C.

Figure 25A:
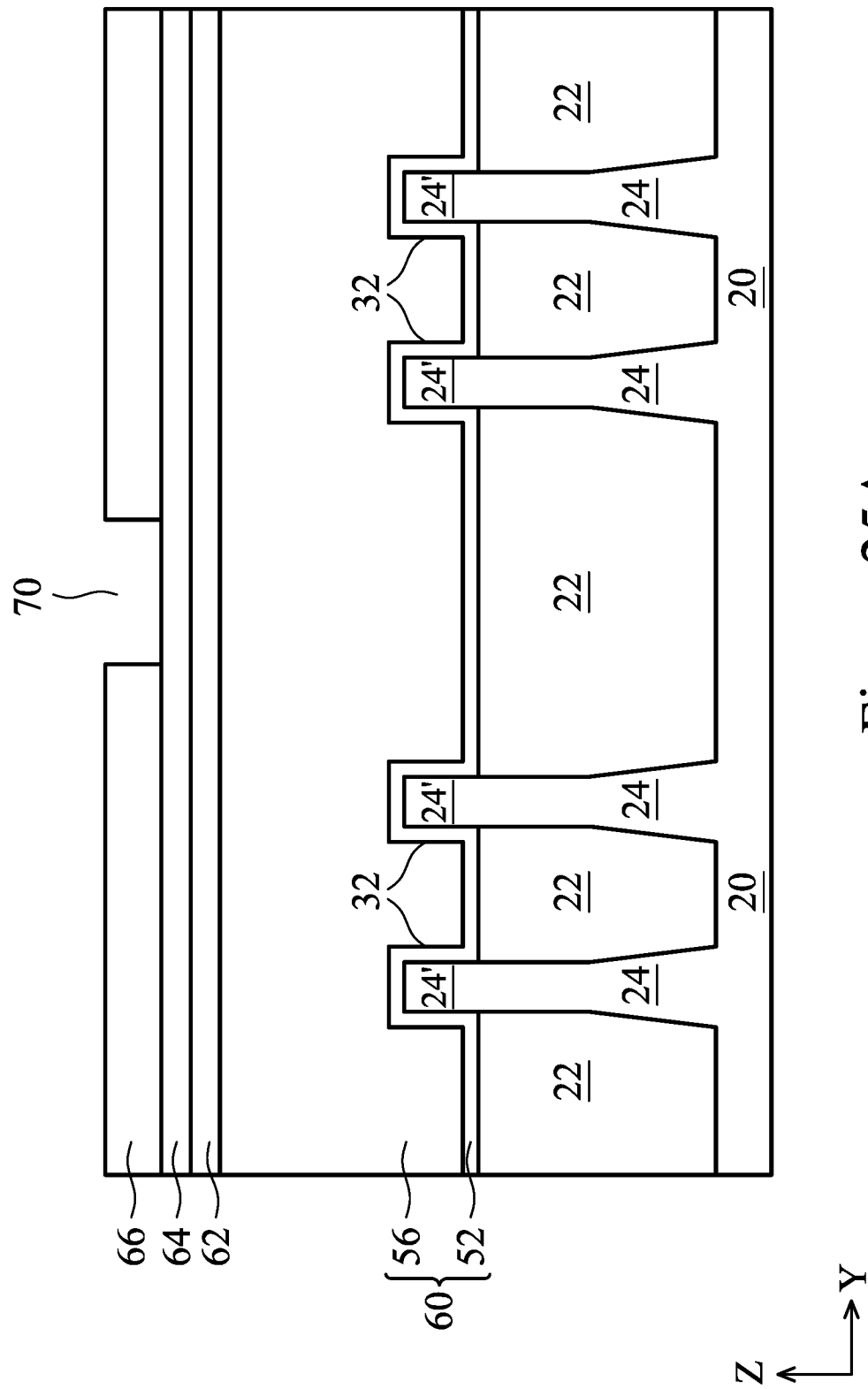
Figure 25B:
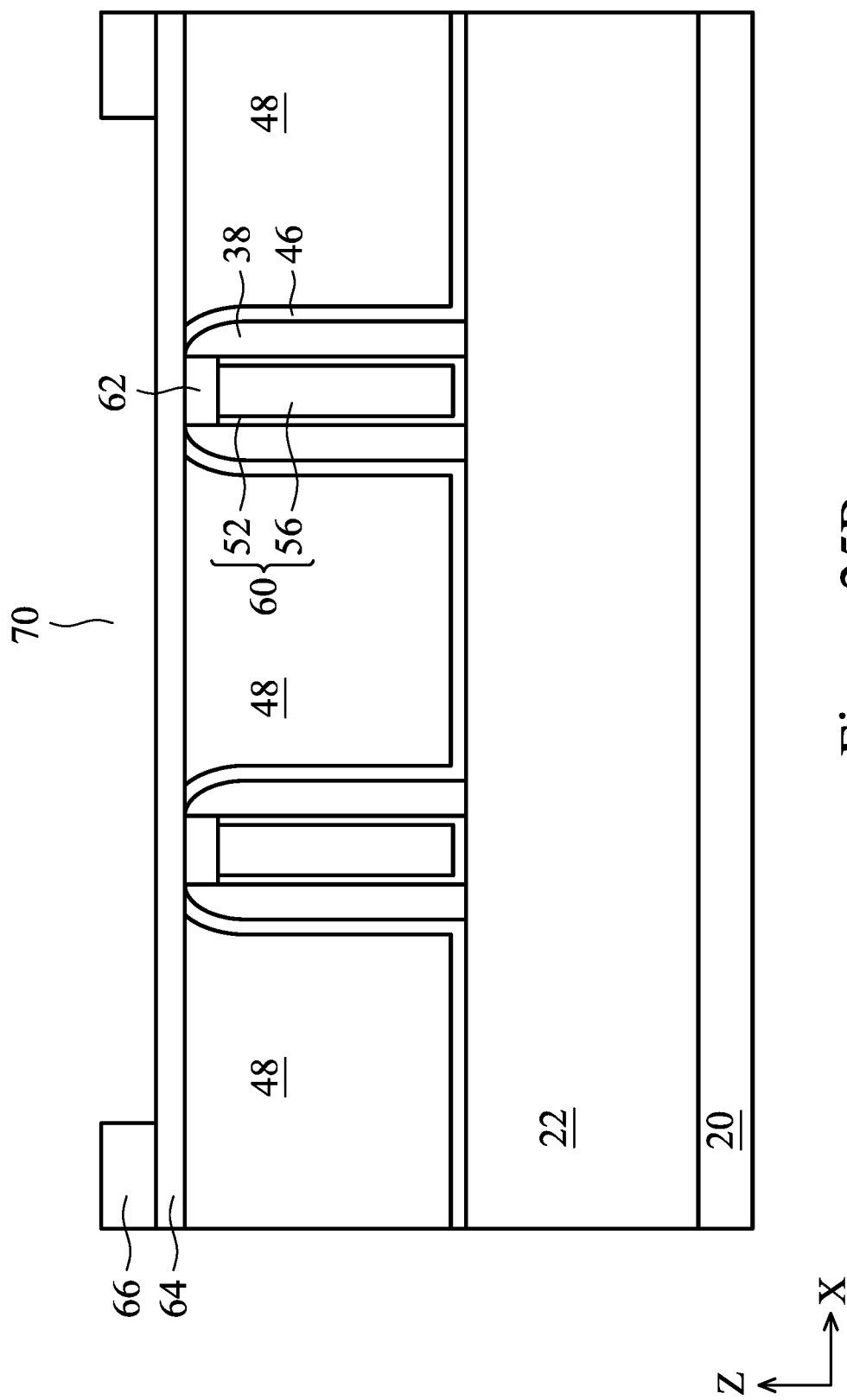
Figure 25C:
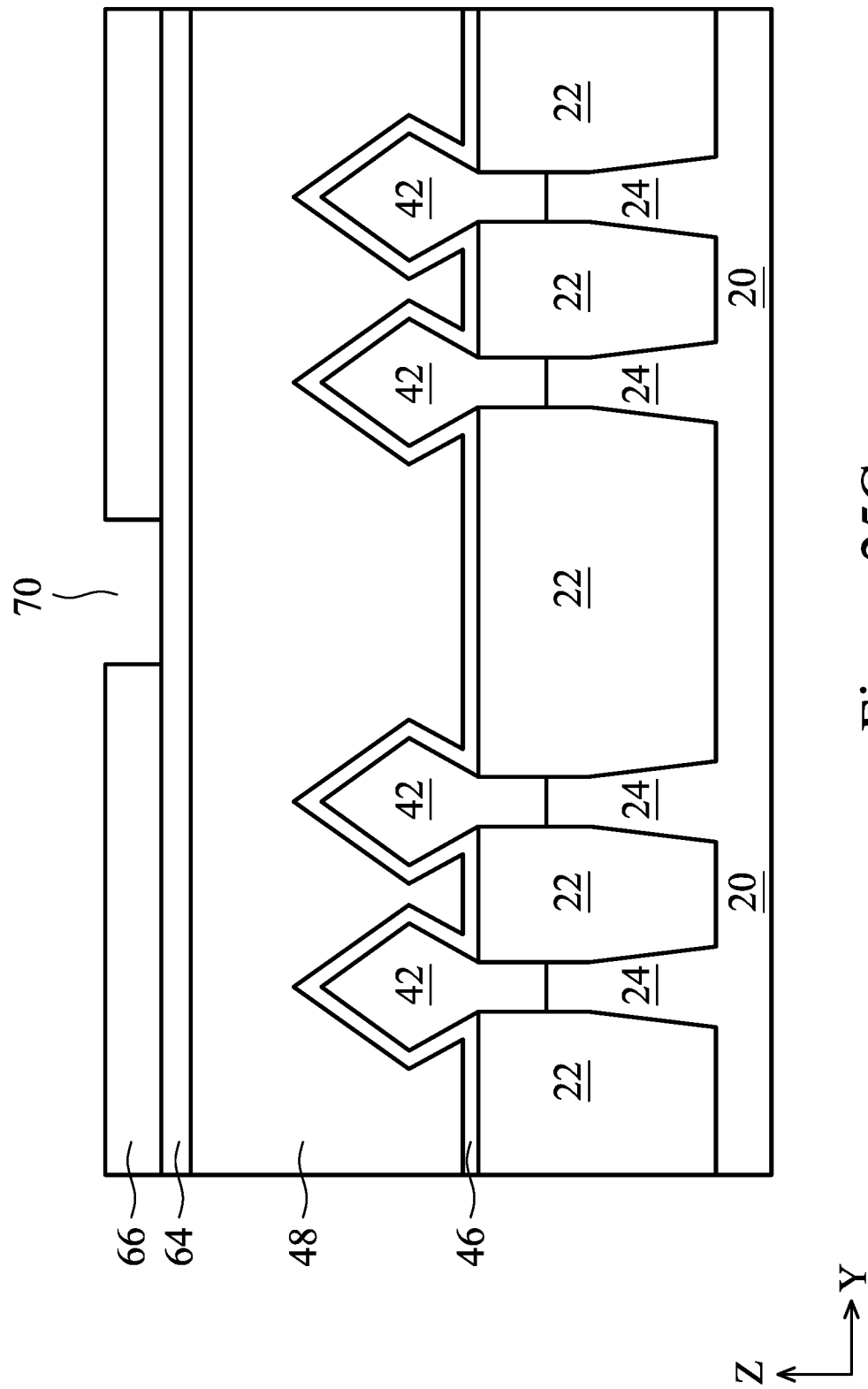

FIGS. 25A, 25B, and 25C illustrate the etching of the hard mask layer 66, in which the patterned photo resist 68 (see FIGS. 23A, 23B, and 23C) is used as an etching mask. The opening 70 thus extends into the hard mask layer 66. The top surface of pad layer 64 is exposed in the opening 70. The patterned photo resist 68 is then removed.

Figure 26A:
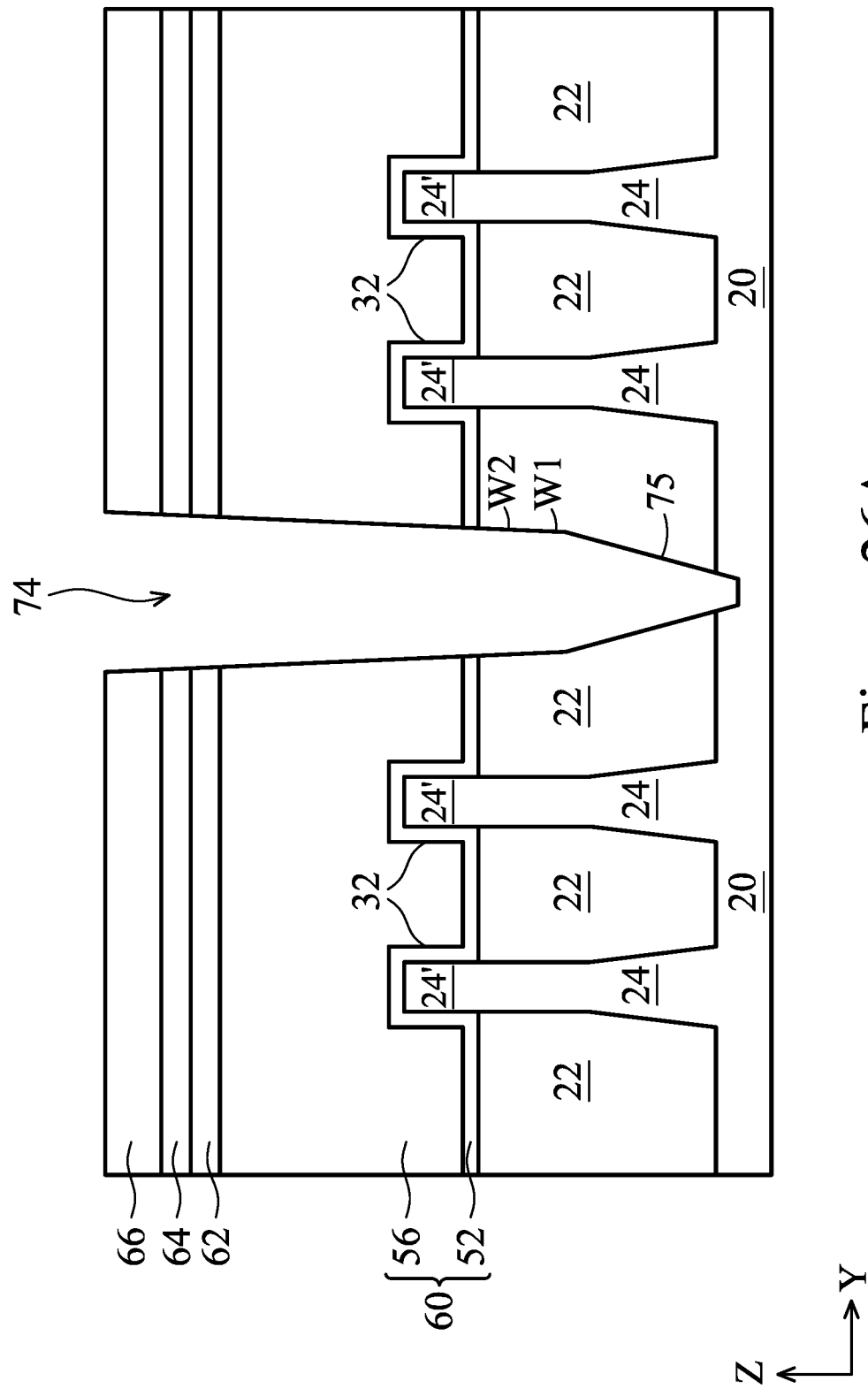
Figure 26B:
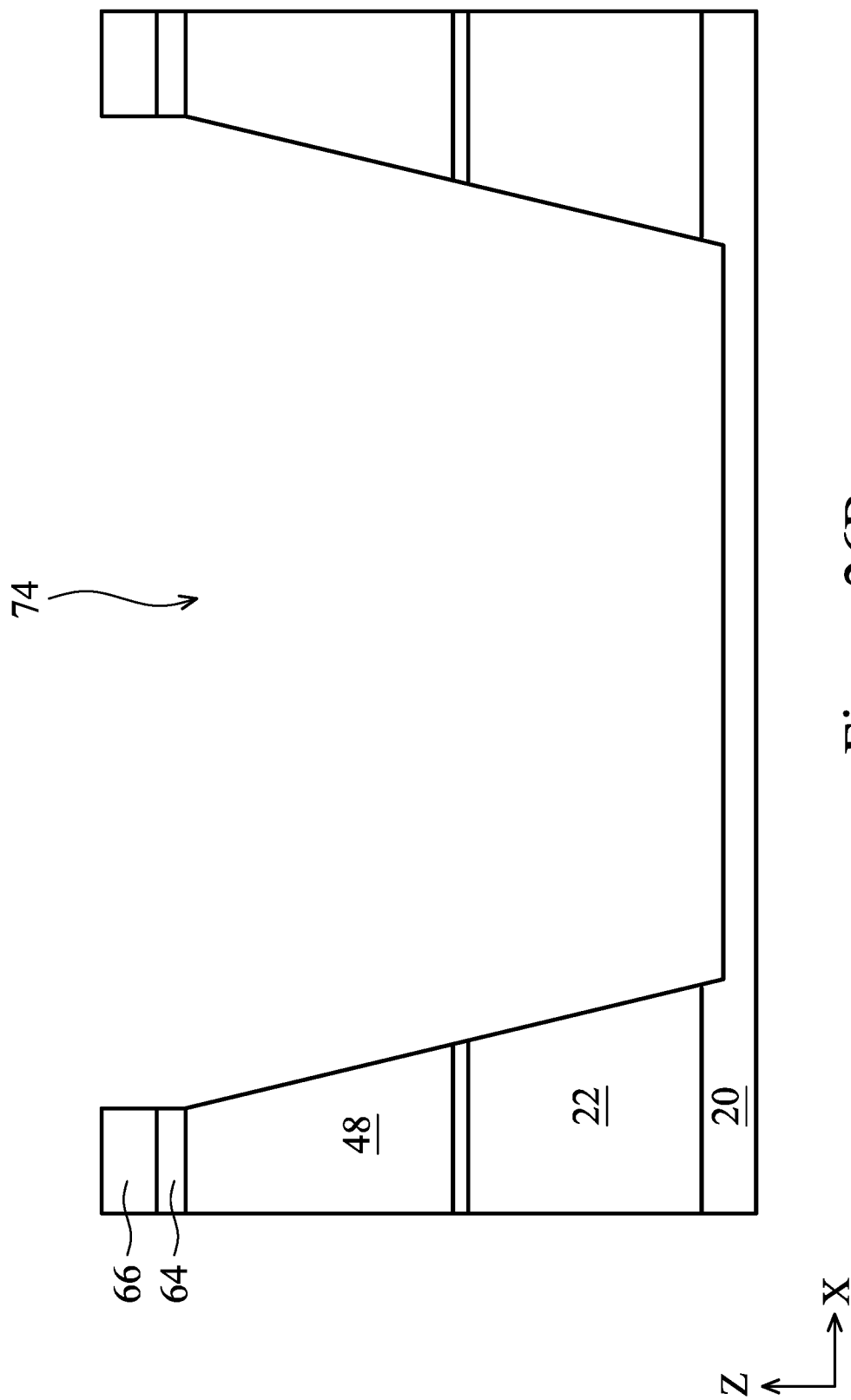
Figure 26C:
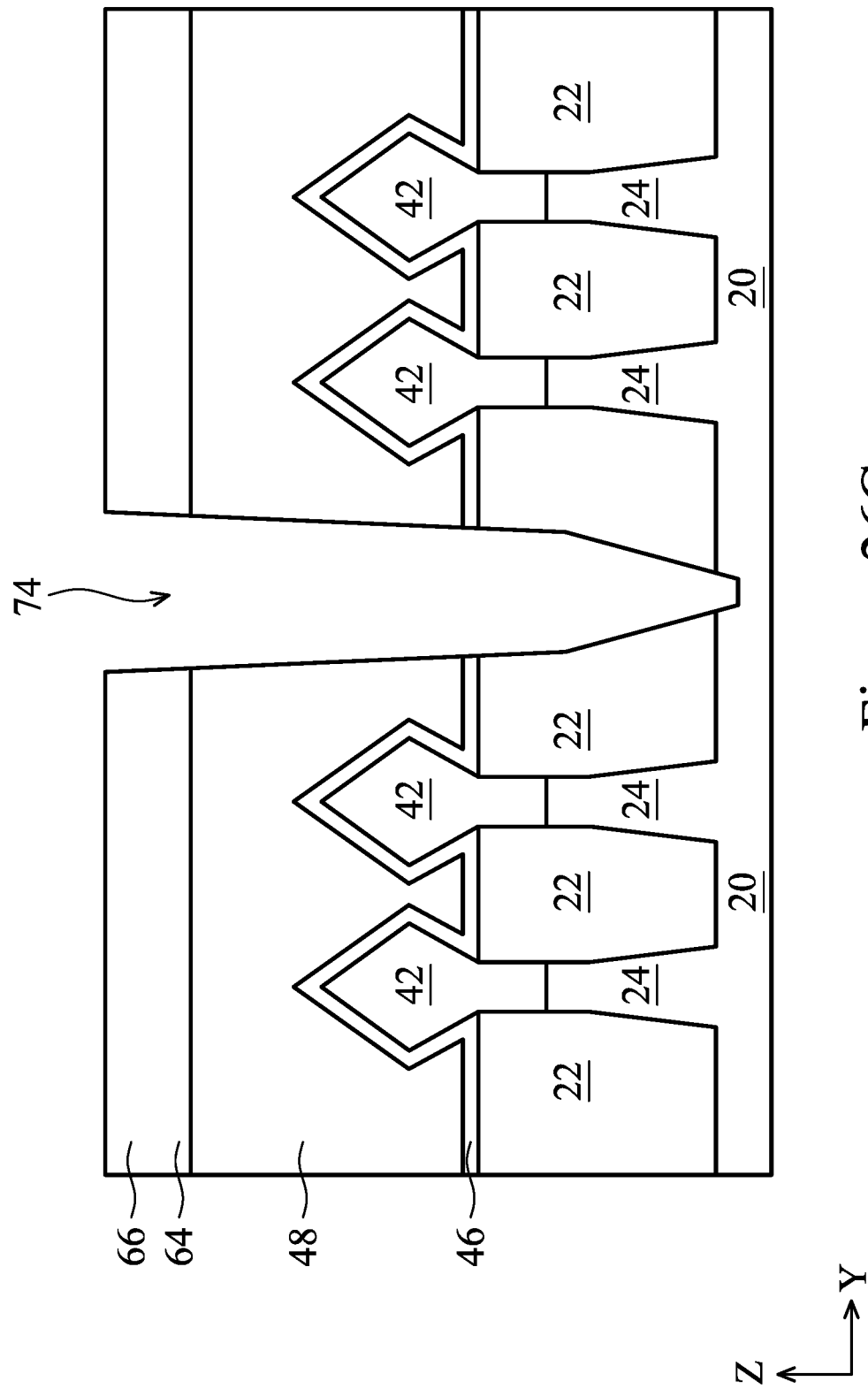

FIGS. 26A, 26B, and 26C illustrate the cutting of the gate stack 60, in accordance with some embodiments. After cutting the gate stack 60, the gate stack 60 will be separated into two separate and electrically isolated gate stacks, each one including a portion of the gate stack 60. It should be understood that the gate stack 60 may be separated into multiple portions of the gate stack 60 by additional simultaneous cutting processes. The pad layer 64 and the underlying hard mask 62 and gate electrode 56 are etched to form trench 74, which extends through the gate electrode 56 to expose the gate dielectric layer 52. Exposed portions of the gate spacers 38 and the exposed portions of the first ILD 48 are also etched. The etching is continued until the now exposed gate dielectric layer 52 is removed, thereby exposing a portion of the isolation regions 22. In some embodiments, the etching may be continued still until at least a portion of the now exposed isolation regions 22 are removed. In some embodiments, the etching may be continued until a portion of the substrate 20 is exposed. In some embodiments, the etching may be continued further still until a portion of the substrate 20 is removed. The etching may include multiple cycles using various etchants effective for the removal of the different materials in the gate stack 60. In some embodiment, the bottom of the trench 74 may be disposed in the isolation regions 22 and may not penetrate the substrate 20.

Figures 1, 27:
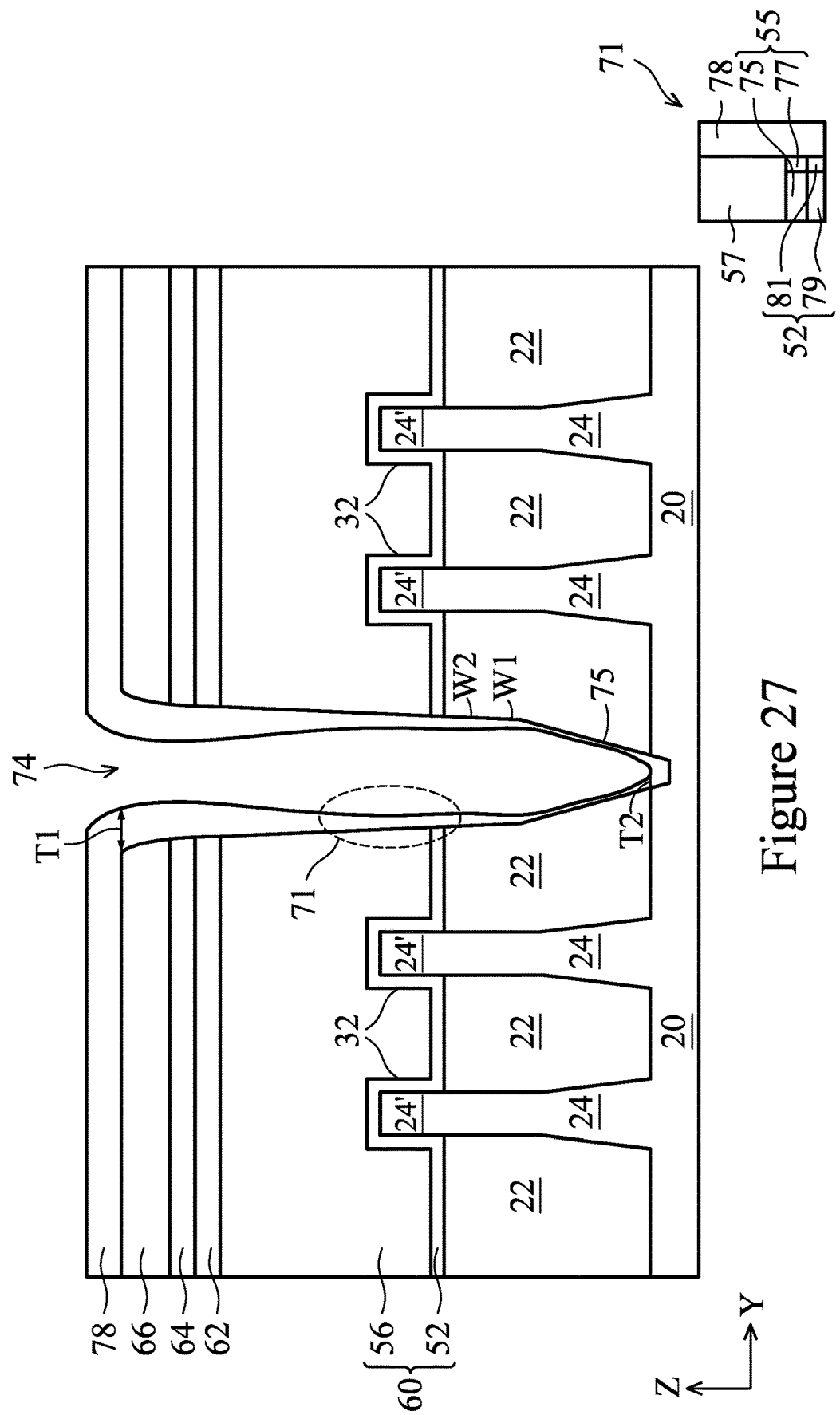

Next, as shown in FIG. 27, a dielectric layer 78 is formed in the trench. The dielectric layer 78 is formed on sidewalls of the hard mask layer 66, the pad layer 64, the hard mask 62, the gate electrode 56, the gate dielectric layer 52, and the isolation region 22. The dielectric layer 78 is also formed on the bottom of the trench 74, which may be on the substrate 20 or the isolation regions 22, depending on the depth of the trench 74. The dielectric layer 78 includes any suitable dielectric material, such as silicon nitride, silicon oxide, silicon carbide, silicon oxynitride, silicon oxy-carbide, and the like. In some embodiments, the dielectric layer 78 includes silicon nitride. The dielectric layer 78 is formed by an ALD process. However, the dielectric layer 78 is not a conformal layer. The term "conformal" may be used herein for ease of description upon a layer having substantial same thickness over various regions. For example, the portion of the dielectric layer 78 located at an upper portion of the trench 74, such as at the opening of the trench 74, has a thickness T1, which is substantially greater than a thickness T2 of the portion of the dielectric layer 78 located at a lower portion of the trench 74, such as at the bottom of the trench 74. The thickness T1 at the opening of the trench 74 enables the formation of a dielectric region having an air gap formed therein. The method of forming a non-conformal dielectric layer 78 using an ALD process is described in detail in FIG. 28.

Figure 28:
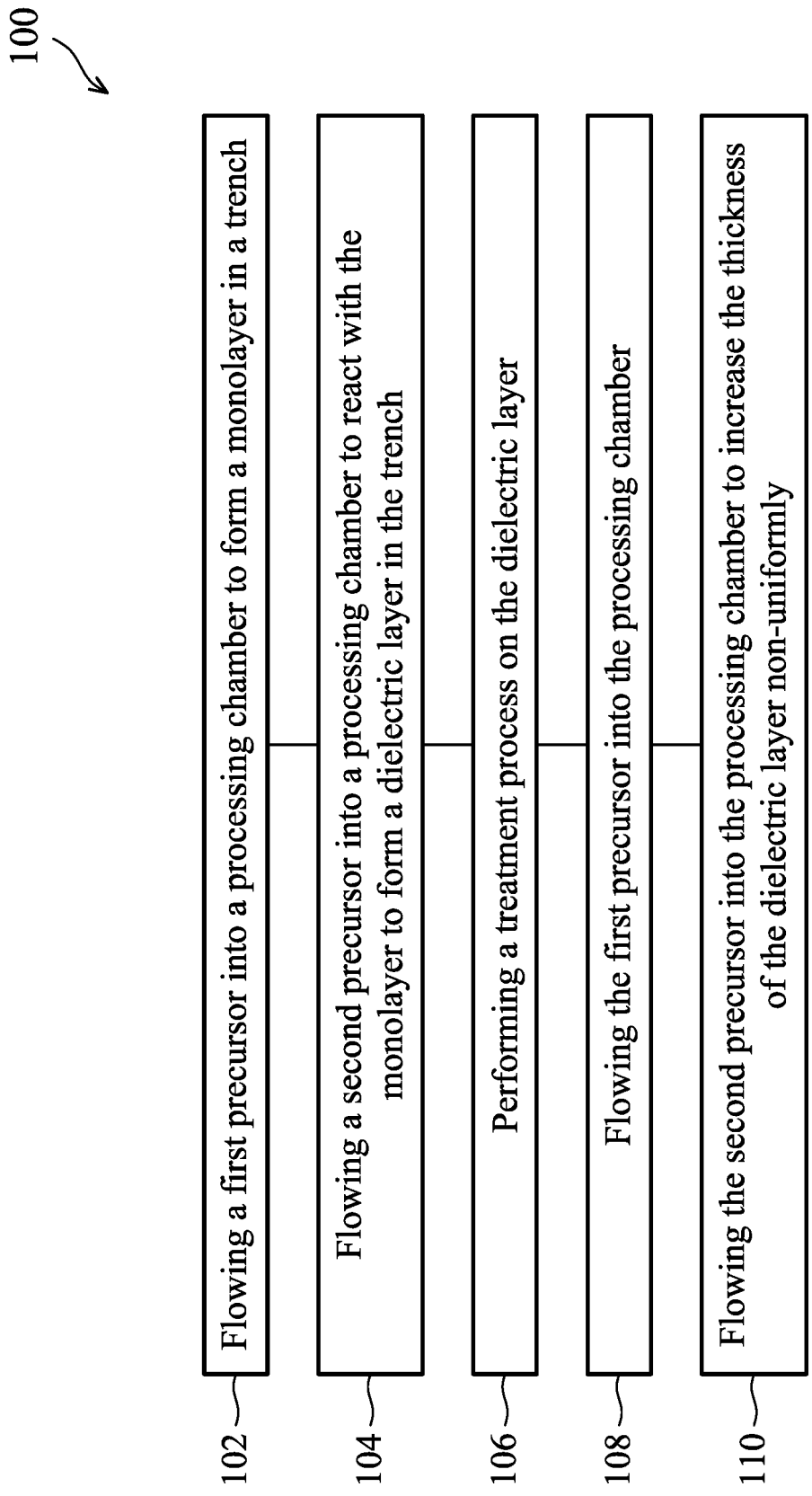
FIG. 28 illustrate a method for forming a non-conformal dielectric layer in a trench of the semiconductor device structure, in accordance with some embodiments.

FIG. 28 illustrate a method 100 for forming the non-conformal dielectric layer 78 in the trench 74 of the semiconductor device structure 10 using an ALD process, in accordance with some embodiments. The method 100 starts with operation 102, which is flowing a first precursor into a processing chamber to form a monolayer in a trench. For example, the semiconductor device structure 10 shown in FIGS. 26A, 26B, 26C is placed in a processing chamber, and a first precursor, which may be a silicon-containing precursor, is flowed into the processing chamber. The first precursor forms a monolayer in the trench 74 and on the hard mask layer 66. The monolayer may be a silicon-containing monolayer. A carrier gas may be flowed into the processing chamber along with the first precursor. The carrier gas may be nitrogen-free and hydrogen-free. In some embodiments, the carrier gas includes argon. During the formation of the monolayer in the trench 74, a plasma source is not turned on. The first precursor may be flowed into the processing chamber for about 1 s to about 30 s. The processing chamber may have a chamber pressure ranging from about 0.1 Torr to about 100 Torr and a processing temperature ranging from about 200 degrees Celsius to about 800 degrees Celsius. In some embodiments, the first precursor is diiodosilane ($SiI_2H_2$) or dichlorosilane (DCS). For example, the first precursor includes $SiI_2H_2$ heated to about 20 degrees Celsius to about 60 degrees Celsius, and the heated $SiI_2H_2$ along with a carrier gas, such as argon, has a combined flow rate ranging from about 0.1 slm to about 30 slm. In another example, the first precursor includes DCS having a flow rate ranging from about 10 sccm to about 10000 sccm.

Next, at operation 104, a second precursor is flowed into the processing chamber to reach with the monolayer to form a dielectric layer in the trench. A purge process may be performed after the operation 102 and before the operation 104 to purge the processing chamber. In some embodiments, the second precursor is a nitrogen-containing precursor, such as $N_2$ or $NH_3$. For example, if the first precursor is $SiI_2H_2$, the second precursor is $N_2$. If the first precursor is DCS, the second precursor is $NH_3$. Additional gases, such as $H_2$ and argon, may be flowed along with the second precursor into the processing chamber. In some embodiments, $N_2$ and $H_2$ gases are flowed into the processing chamber, and a ratio of the flow rate of $H_2$ to the flow rate of $N_2$ gases ranges between about 0.4 sccm to about 1 slm and about 0.9 sccm to about 1 slm. For example, the flow rate of $N_2$ may range from about 20 slm to about 40 slm, and the flow rate of $H_2$ may range from about 10 sccm to about 30 sccm. In some embodiments, $NH_3$ and $H_2$ gases are flowed into the processing chamber, and a ratio of the flow rate of $H_2$ to the flow rate of $NH_3$ gases ranges between about 0.4 sccm to about 1 slm and about 0.9 sccm to about 1 slm. For example, the flow rate of $NH_3$ may range from about 25 slm to about 45 slm, and the flow rate of $H_2$ may range from about 10 sccm to about 30 sccm. The second precursor may be flowed into the processing chamber for about 1 s to about 30 s.

During the flowing of the second precursor and the $H_2$ gas into the processing chamber, the plasma source is turned on, the plasma power ranges from about 50 W to about 800 W and the plasma frequency ranges from about 1 MHz to about 13.56 MHz. As a result, the second precursor reacts with the monolayer to form a dielectric layer, such as silicon nitride. At this stage, the dielectric layer is conformal and has a uniform thickness in various regions. The conformal dielectric layer is formed on the sidewalls and the bottom in the trench 74 and on the hard mask layer 66. The operations 102 and 104 may be a cycle of an ALD process.

Next, at operation 106, a treatment process is performed on the dielectric layer. A purge process may be performed after the operation 104 and before the operation 106 to purge the processing chamber. The treatment process includes flowing a hydrogen-containing gas into the processing chamber with the plasma source turned on. The hydrogen-containing gas may be $H_2$. The hydrogen plasma treatment of the dielectric layer can modify the surface bonds to be hydrogenated, which leads to easier adsorption of the next precursor on the dielectric layer. Furthermore, the portions of the dielectric layer located on the hard mask layer 66 and on the top portion of the trench 74 (i.e., at the opening of the trench 74) are exposed to stronger hydrogen plasma treatment compared to the portions of the dielectric layer located in the trench 74 and at the bottom of the trench 74, which are exposed to weaker hydrogen plasma, because there are less active species (i.e., hydrogen ions and radicals) in the trench 74. As a result, more first precursor in subsequent cycle would be adsorbed on the portions of the dielectric layer located at the opening of the trench 74, and the thickness of portions of the dielectric layer at the opening of the trench 74 would be increasing faster than the thickness of other portions of the dielectric layer after subsequent cycles of the ALD process. Thus, the dielectric layer would grow to a non-conformal layer by the ALD process, and the opening of the trench 74 is closed before the trench 74 is completely filled. As a result, a void or air gap 84 (FIGS. 29A, 29B, 29C) is formed in the dielectric layer.

In addition to the hydrogen-containing gas, the treatment process may also include a nitrogen-containing gas, such as $N_2$ or $NH_3$. In some embodiments, a ratio of the flow rate of the hydrogen-containing gas to the flow rate of the nitrogen-containing gas ranges between about 5 sccm to about 1 slm and about 20 sccm to about 1 slm. For example, the flow rate of the nitrogen-containing gas may range from about 5 slm to about 15 slm, and the flow rate of the hydrogen-containing gas may range from about 50 sccm to about 200 sccm. If the ratio of the flow rate of the hydrogen-containing gas to the flow rate of the nitrogen-containing gas is less than about 5 sccm to about 1 slm, not enough hydrogenation of the surface bonds, leading to a conformal dielectric layer. On the other hand, if the ratio of the flow rate of the hydrogen-containing gas to the flow rate of the nitrogen-containing gas is greater than about 20 sccm to about 1 slm, the quality of the dielectric layer, such as a silicon nitride layer, is reduced.

Referring to FIG. 27-1, which shows an enlarged view of a portion 71 of FIG. 27, in some embodiments, the gate electrode 56 includes the work function tunning layer 55 and the fill material 57, and the gate electrode 56 is disposed on the gate dielectric layer 52. In some embodiments, the hydrogen from the treatment process may diffuse into the gate dielectric layer 52 and the work function tunning layer 55. As a result, the gate dielectric layer 52 includes an inner portion 79 having a first hydrogen concentration and an outer portion 81 having a second hydrogen concentration greater than the first hydrogen concentration. In some embodiments, the inner portion 79 is substantially hydrogen free. The outer portion 81 is at the interface between the gate dielectric layer 52 and the dielectric layer 78, and the hydrogen from the treatment process diffuses through the dielectric layer formed by operations 102 and 104 and into the outer portion 81 of the gate dielectric layer 52. Similarly, the work function tunning layer 55 includes an inner portion 75 having a first hydrogen concentration and an outer portion 77 having a second hydrogen concentration greater than the first hydrogen concentration. In some embodiments, the inner portion 75 is substantially hydrogen free. The outer portion 77 is at the interface between the work function tunning layer 55 and the dielectric layer 78, and the hydrogen from the treatment process diffuses through the dielectric layer formed by operations 102 and 104 and into the outer portion 77 of the work function tunning layer 77. In other words, the treatment process described in operation 106 may substantially change the composition of the gate dielectric layer 52 and the work function tunning layer 55 so the outer portions 81, 77 at the interface may include a substantially higher hydrogen concentration compared to the rest of the gate dielectric layer 52 and the work function tunning layer 55, respectively. In some embodiments, the fill material 57 of the gate electrode 56 may not be affected because the hydrogen does not diffuse into the material, such as a metal, of the fill material 57.

Next, at operation 108, the first precursor is flowed into the processing chamber. A purge process may be performed after the operation 106 and before the operation 108 to purge the processing chamber. More molecules of the first precursor may be adsorbed on the portions of the dielectric layer located on the hard mask layer 66 and at the opening of the trench 74 than on the portions of the dielectric layer located in the trench 74. The process conditions of operation 108 may be the same as the operation 102.

Next, at operation 110, the second precursor is flowed into the processing chamber to increase the thickness of the dielectric layer non-uniformly. A purge process may be performed after the operation 108 and before the operation 110 to purge the processing chamber. Similar to the operation 104, the second precursor reacts with the molecules of the first precursor to form the dielectric layer (i.e., to increase the thickness of the dielectric layer formed at operation 104). Because more molecules of the first precursor are adsorbed on the portions of the dielectric layer located on the hard mask layer 66 and at the opening of the trench 74, the portions of the dielectric layer located on the hard mask layer 66 and at the opening of the trench 74 have a thickness that is substantially greater than a thickness the portions of the dielectric layer located inside of the trench 74 as the second precursor reacts with the adsorbed molecules. In other words, the dielectric layer after operation 110 is a non-conformal layer formed by the ALD process. In some embodiments, the dielectric layer 78 shown in FIG. 27 is the result of the method 100.

After operation 110, the cycle (i.e., the operations 108 and 110) of the ALD process may be repeated until the opening of the trench 74 is closed. In other words, the cycle may be repeated until the trench 74 is filled with the dielectric layer 78 having the air gap 84 (FIGS. 29A, 29B, 29C) formed therein. The treatment process (operation 106) may be performed once or multiple times during the ALD process. The location and the size of the air gap 84 (FIGS. 29A, 29B, 29C) may be controlled by when to perform the treatment process and/or how many times the treatment process is performed. For example, in some embodiments, 100 to 150 cycles are performed to fill the trench 74 with the dielectric layer 78 having the air gap 84 formed therein, and the treatment process is performed after the first cycle. With the treatment process performed at an early stage of the ALD process, the air gap 84 is located near the bottom of the trench 74. On the other hand, if the treatment process is performed at a later stage of the ALD process, the air gap 84 is located near the top of the trench 74. If the treatment process is performed once, the size of the air gap 84 is substantially smaller than the size of the air gap 84 formed with multiple treatment processes.

Figure 29A:
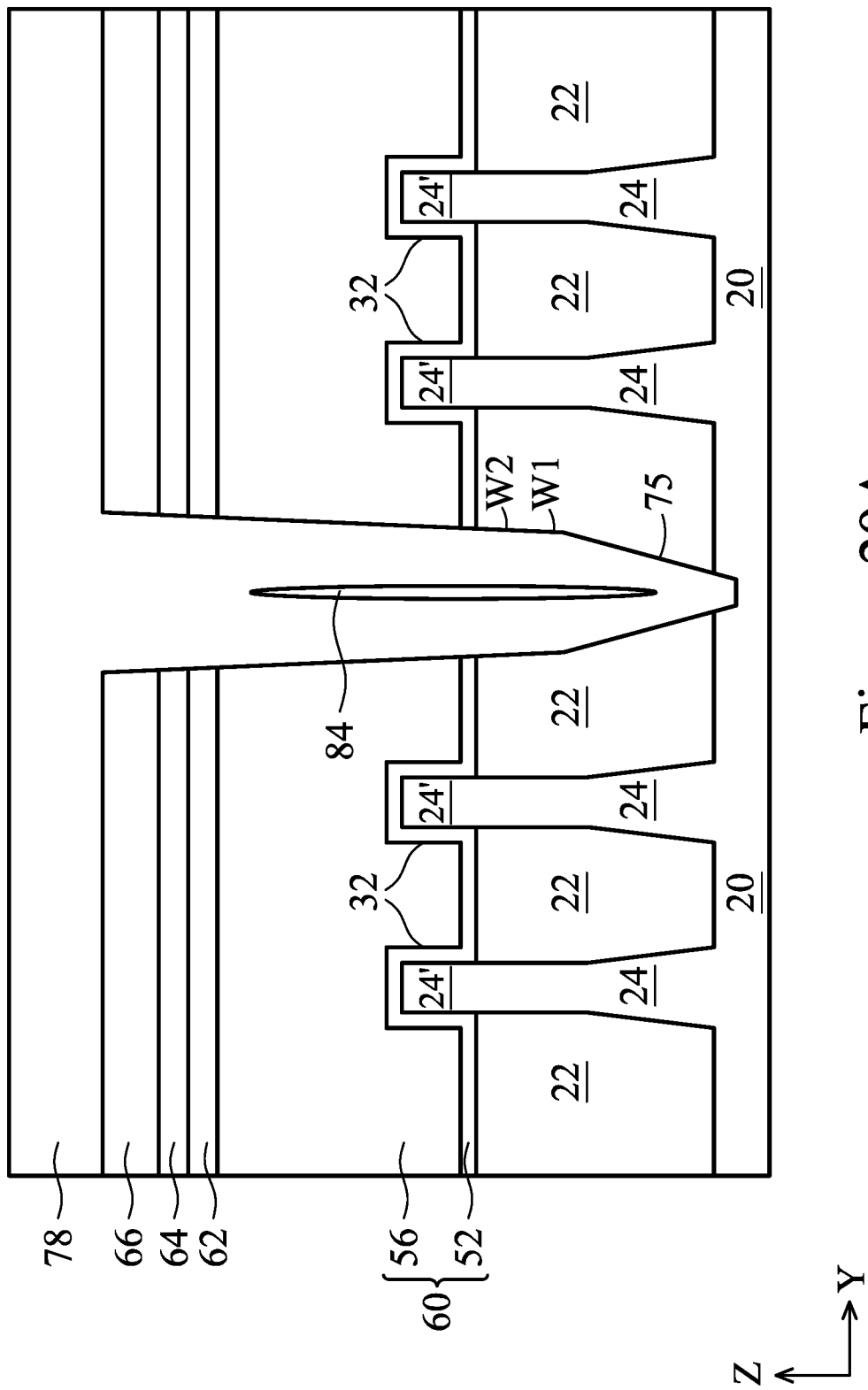
Figure 29B:
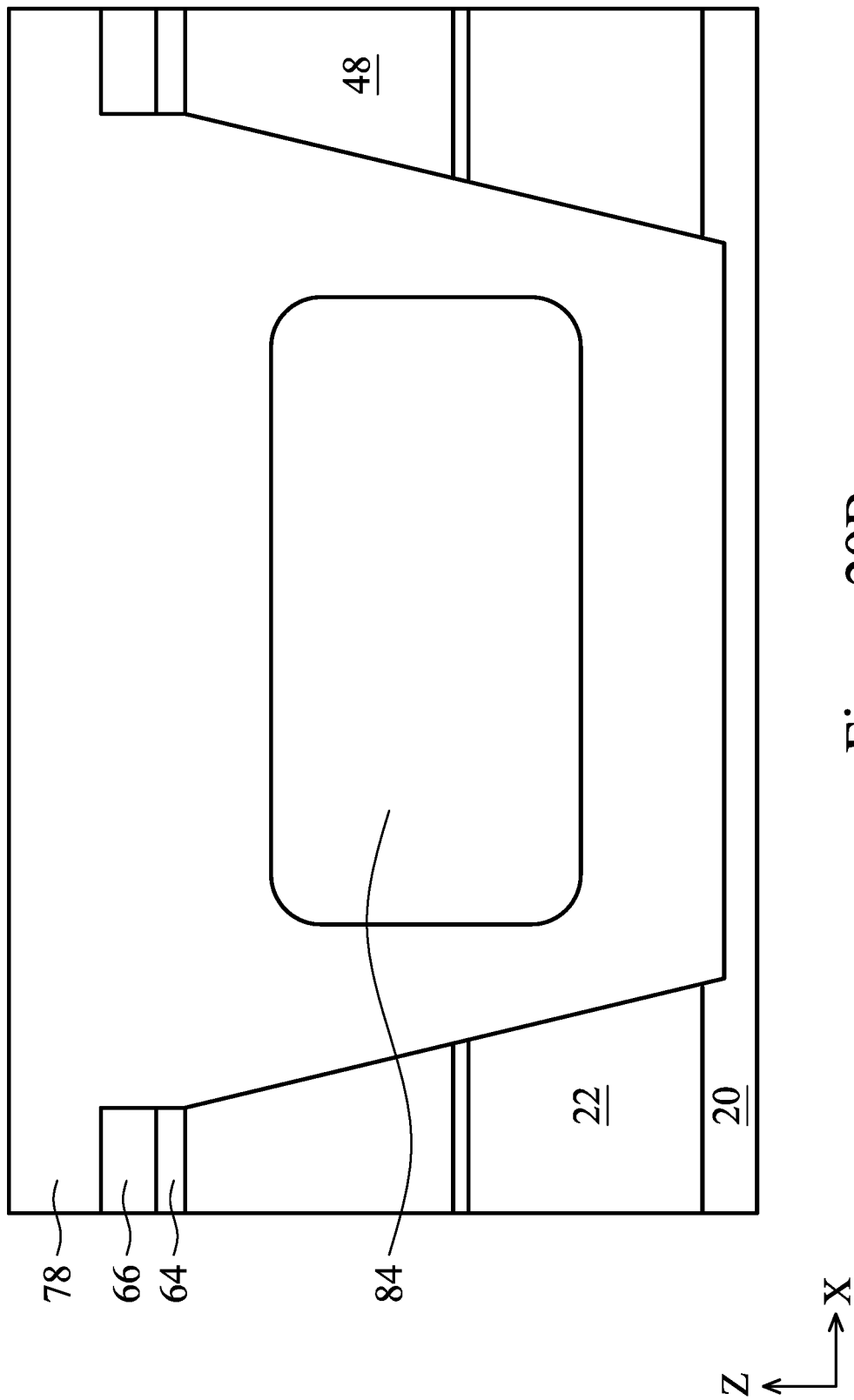
Figure 29C:
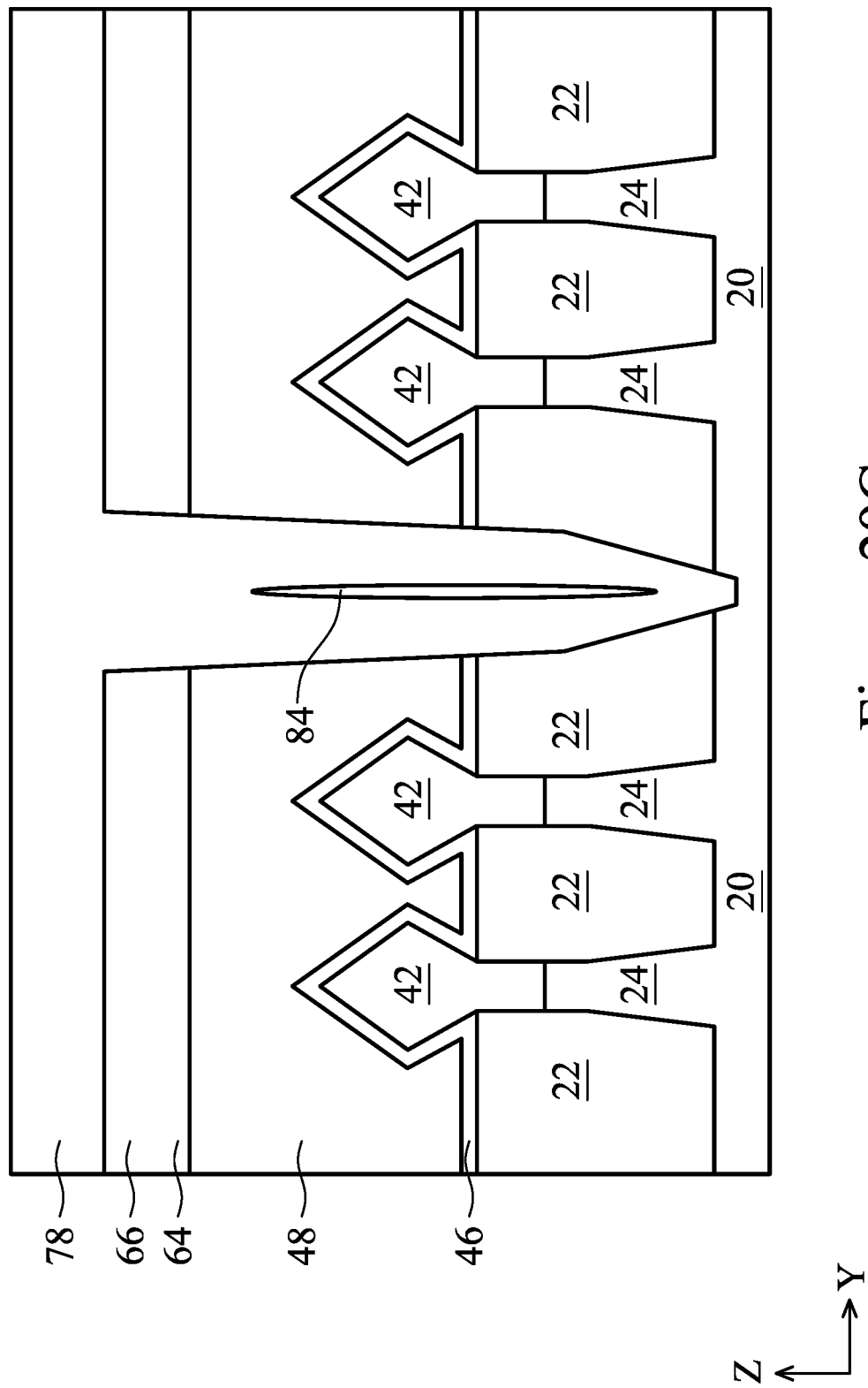

As shown in FIGS. 29A, 29B, 29C, at the end of the ALD process, the dielectric layer 78 fills the trench 74 (except for the air gap 84) and is disposed on the hard mask layer 66. As described above, the dielectric layer 78 having the air gap 84 formed therein is a result of an ALD process. In some embodiments, the dielectric layer 78 is formed by CVD, and an air gap is formed therein. However, the quality of the dielectric layer 78 formed by CVD is not as good as the quality of the dielectric layer 78 formed by ALD. For example, the dielectric layer 78 formed by ALD may be more resistant to subsequent etch processes than the dielectric layer 78 formed by CVD. As described above, the size and the location of the air gap 84 can be tuned by the timing and the number of the treatment process during the ALD process.

The dielectric layer 78 formed by ALD with the air gap 84 formed therein may be placed in other regions of the semiconductor device structure 10 in order to improve insulating properties. For example, the dielectric layer 78 having the air gap 84 formed therein may be placed in middle-of-line (MOL) or back-end-of-line (BEOL) structures in order to reduce leakage current from adjacent conductive features.

Figure 30A:
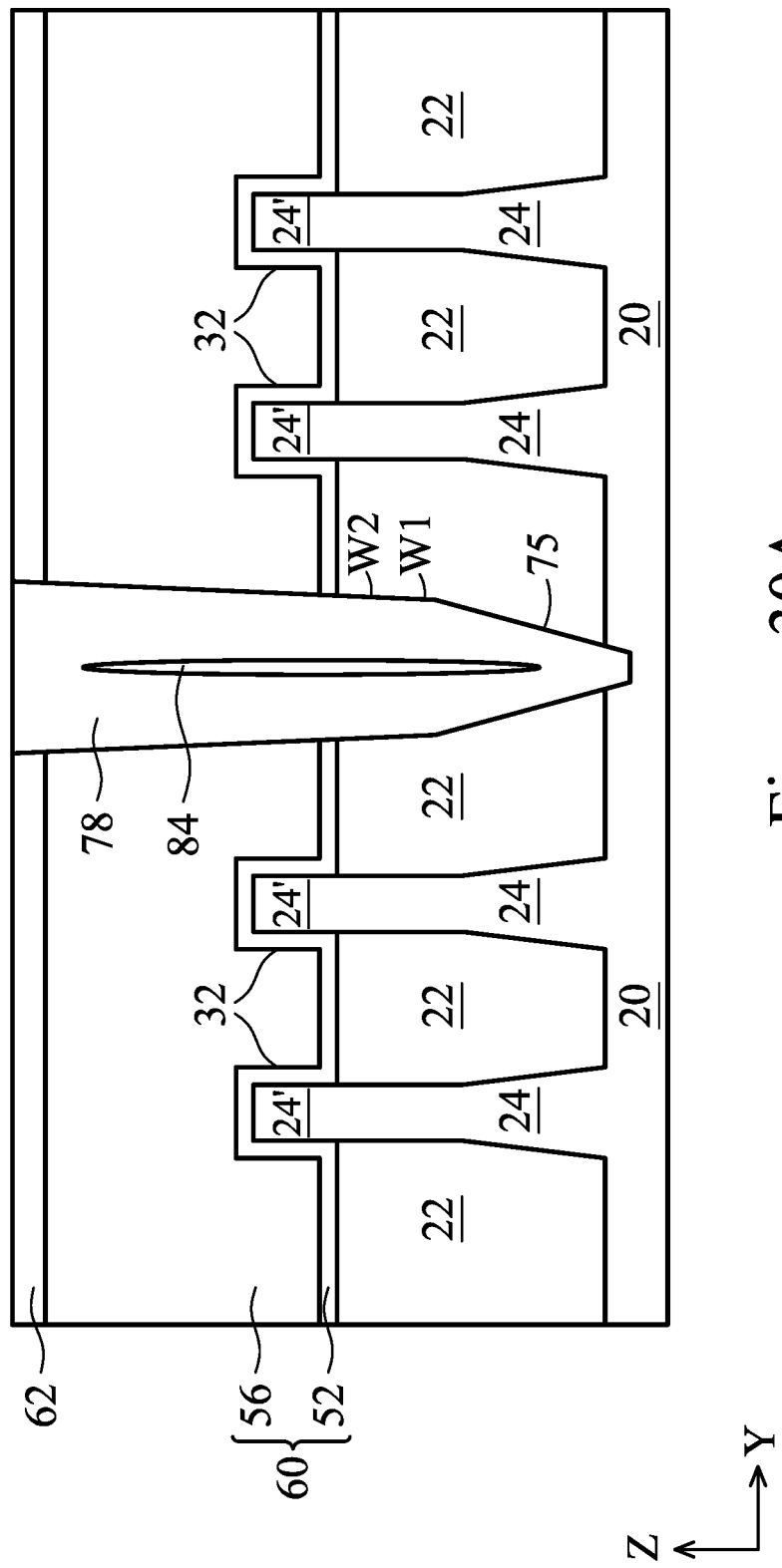
Figure 30B:
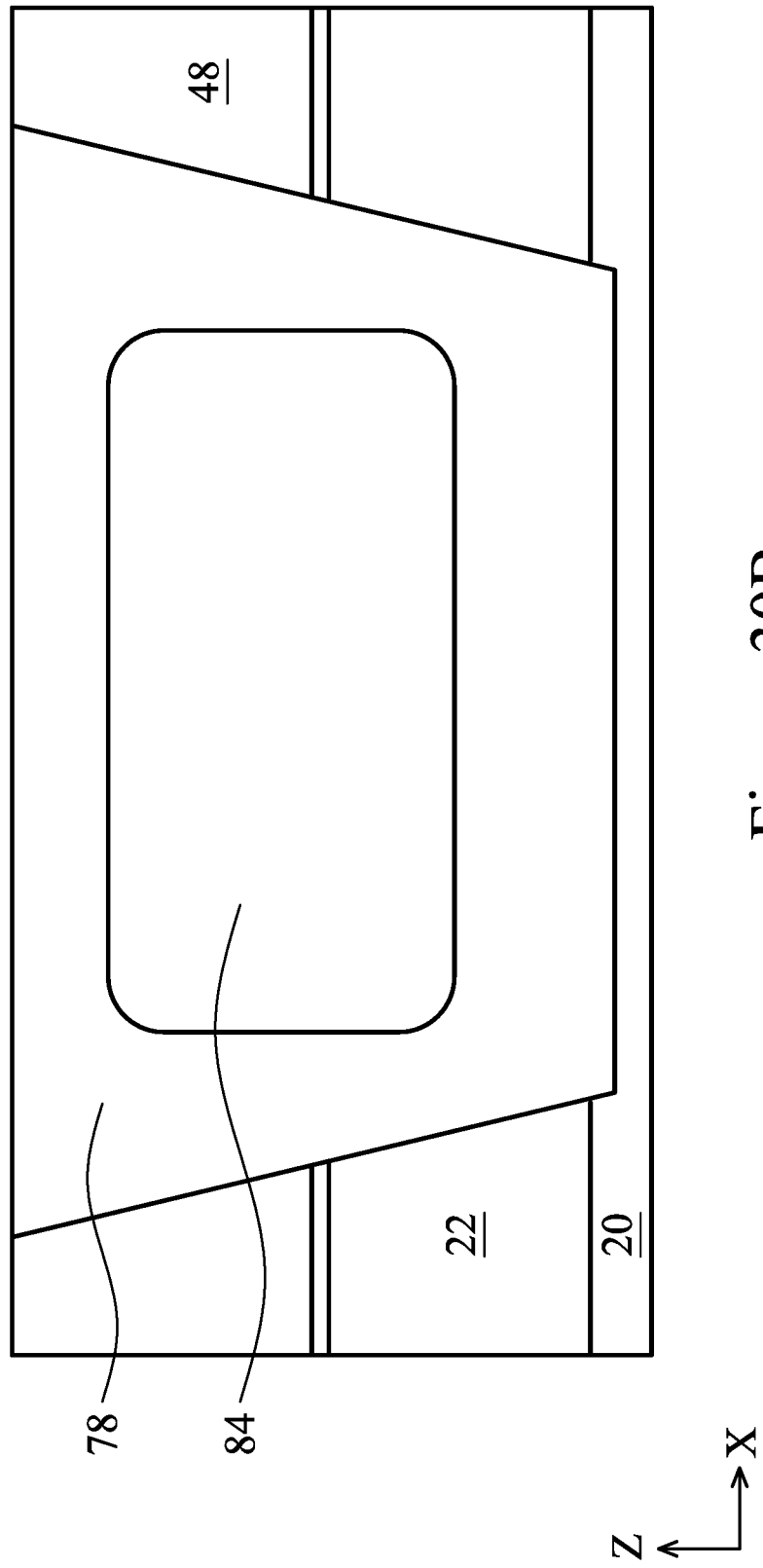
Figure 30C:
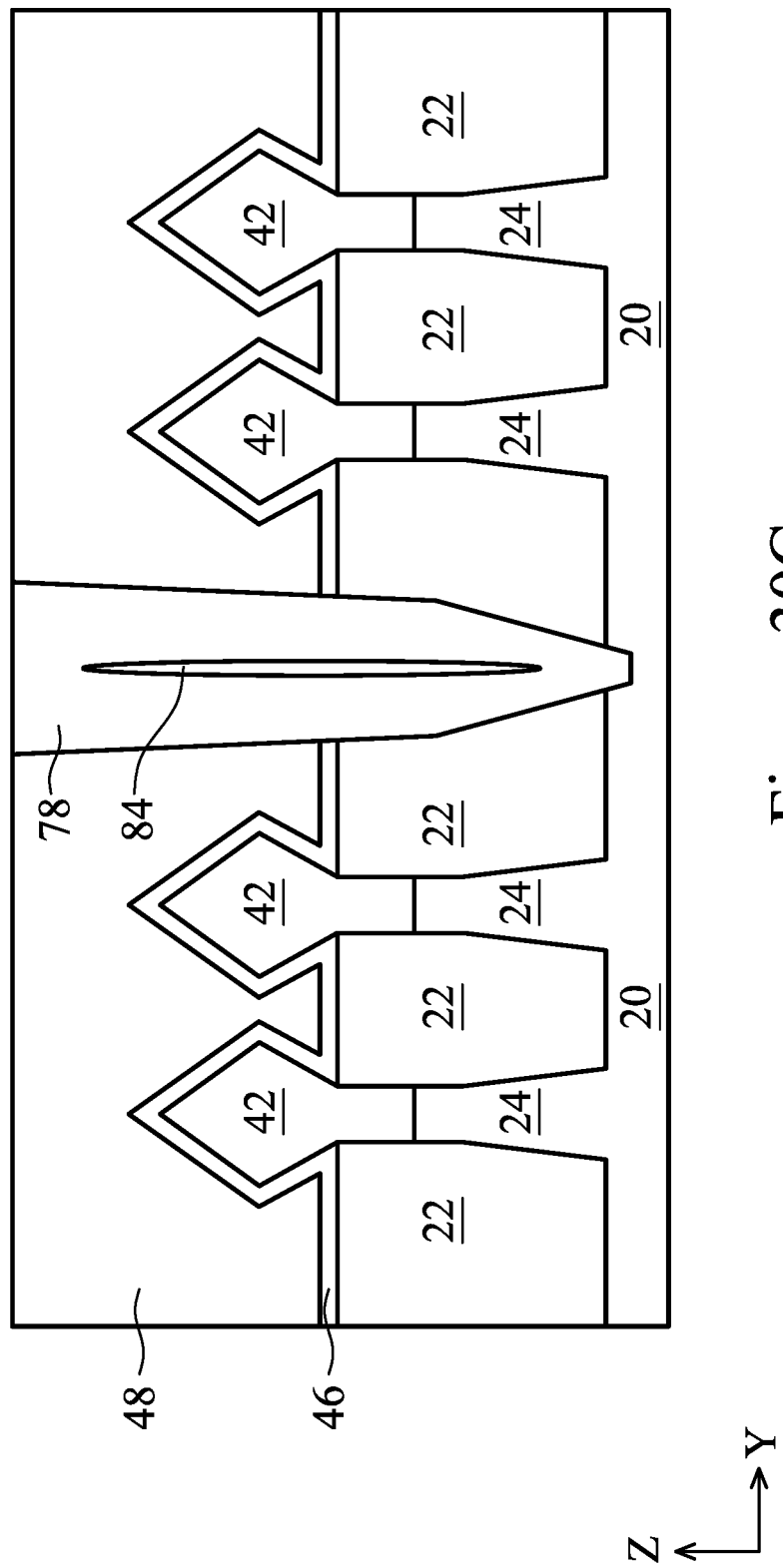

As shown in FIGS. 30A, 30B, 30C, a planarization is performed such as a CMP process or a mechanical grinding process to remove the excess portions of the dielectric layer 78, and to level the top surface of the dielectric layer 78 with the top surface of the first ILD 48 and the top surface of the hard mask 62.

Figure 31A:
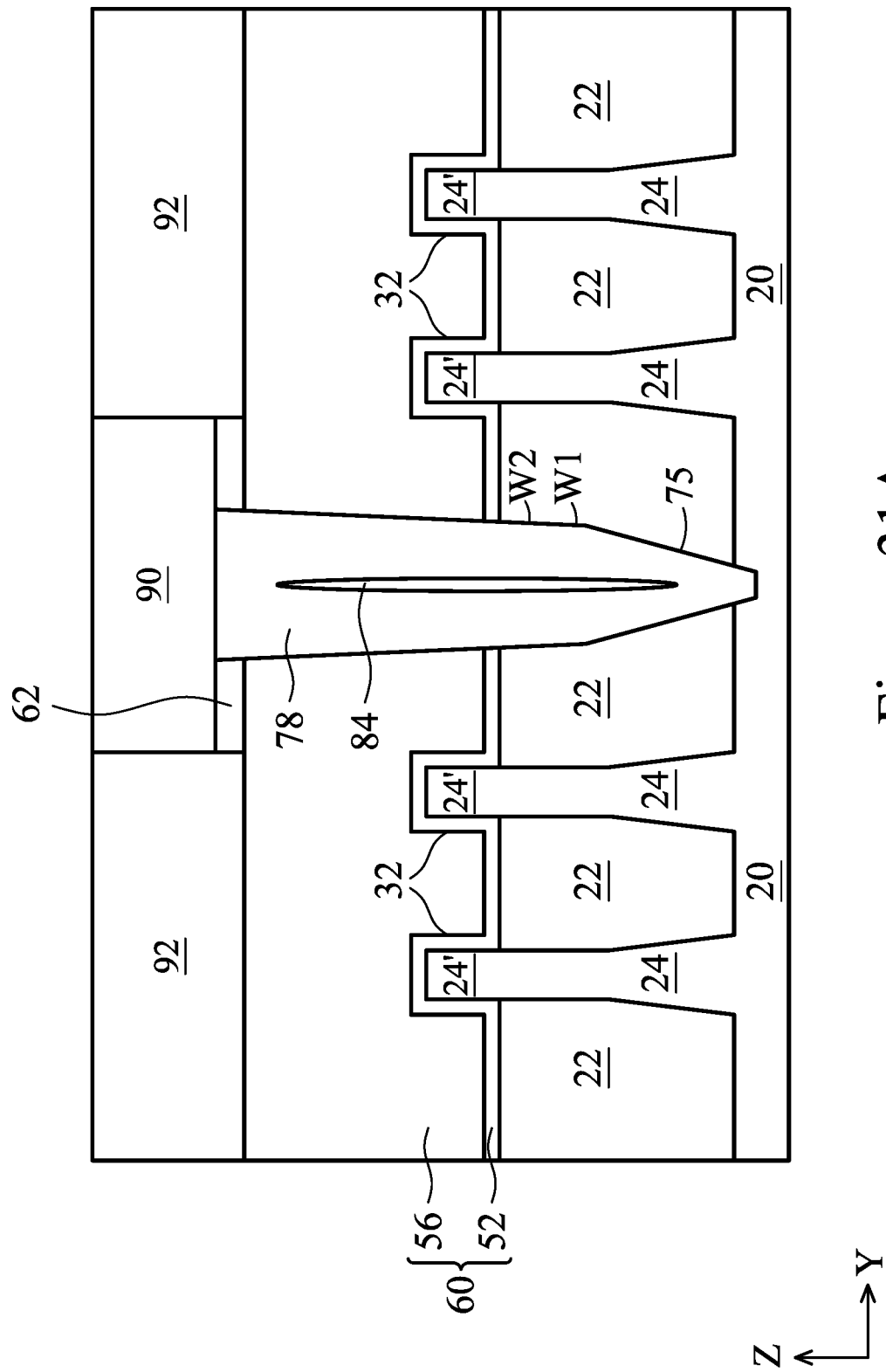
Figure 31B:
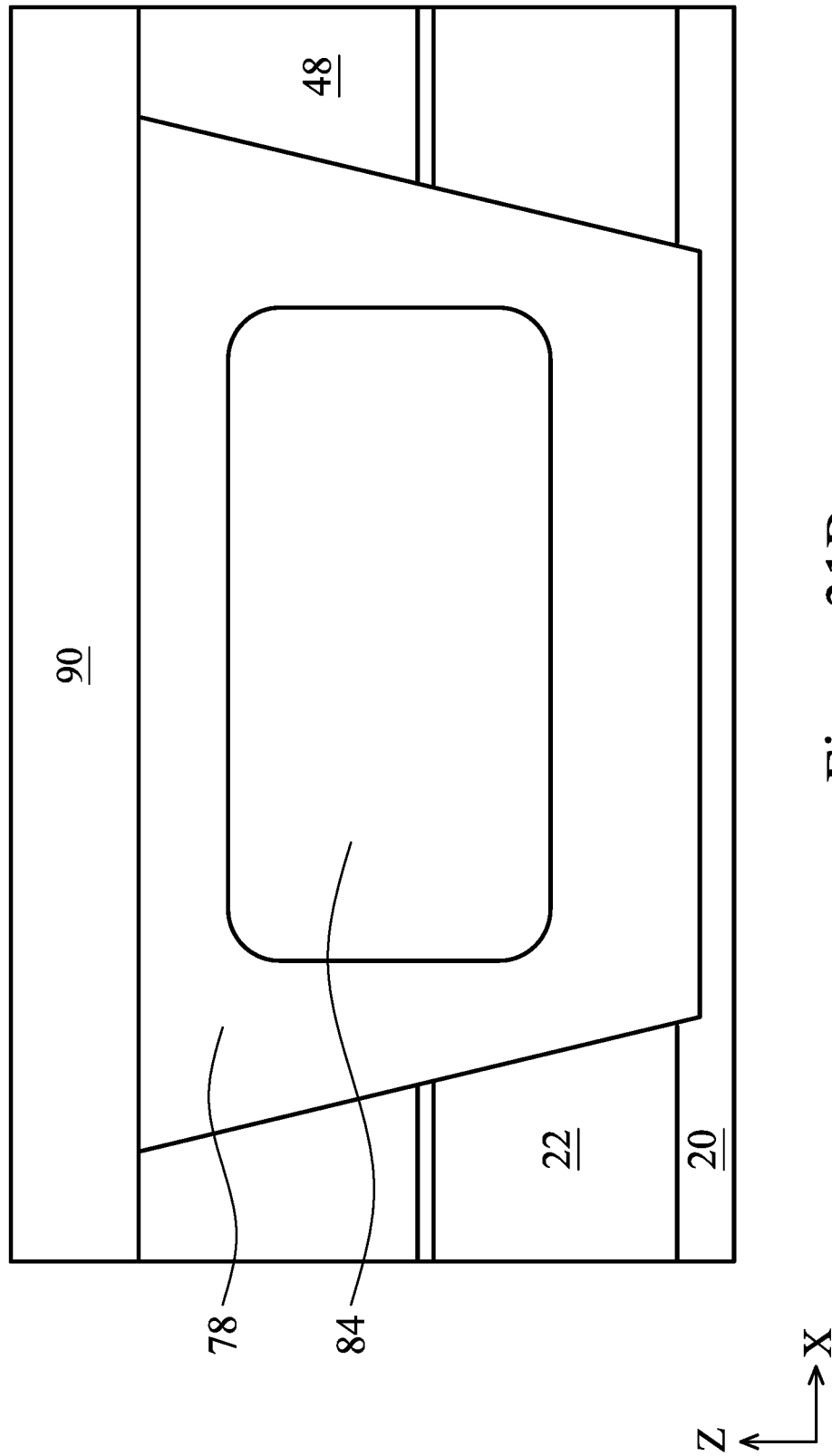
Figure 31C:
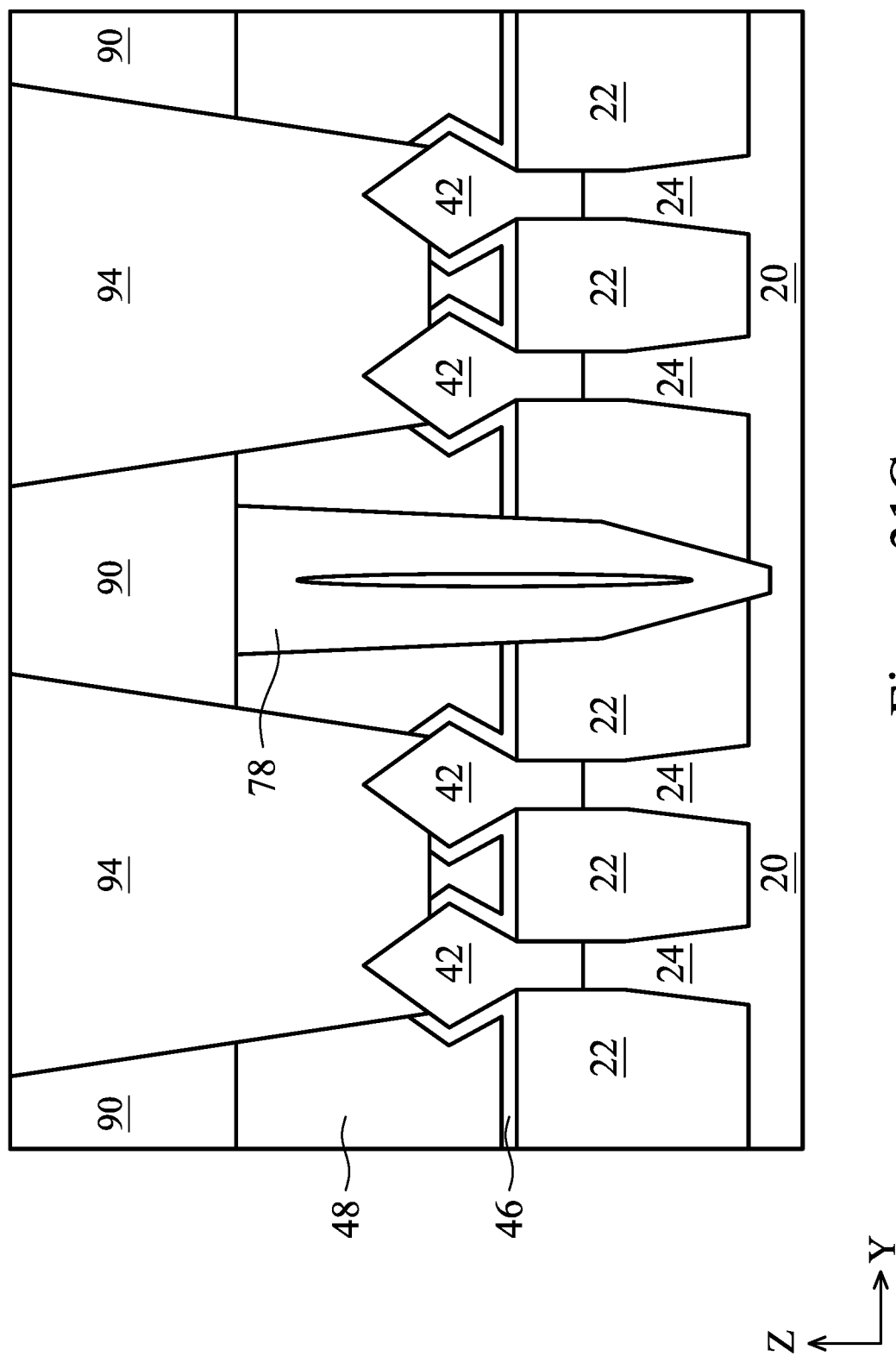

As shown in FIGS. 31A, 31B, 31C, a second ILD 90 is deposited over the first ILD 48. In some embodiments, the second ILD 90 is a flowable film formed by a flowable CVD method. In some embodiments, the second ILD 90 is formed of a dielectric material such as PSG, BSG, BPSG, USG, or the like, and may be deposited by any suitable method, such as CVD and PECVD. As shown in FIGS. 31A and 31C, gate contacts 92 and source/drain contacts 94 are formed through the second ILD 90 and the first ILD 48 in accordance with some embodiments. Openings for the source/drain contacts 94 are formed through the first ILD 48 and the second ILD 90, and openings for the gate contact 92 are formed through the second ILD 90 and the hard masks 62. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 90. The remaining liner and conductive material form the source/drain contacts 94 and gate contacts 92 in the openings. An anneal process may be performed to form a silicide at the interface between the epitaxial source/drain regions 42 and the source/drain contacts 94. The source/drain contacts 94 are physically and electrically coupled to the epitaxial source/drain regions 42, and the gate contacts 92 are physically and electrically coupled to the gate electrodes 56. However, gate contacts 92 coupled to one cut portion of the gates stacks 60 are electrically isolated from the gate contacts 92 coupled to another cut portion of the gate stacks 60 due to the dielectric layer 78 having the air gap 84. The dielectric constant (k value) of the air gap 84 is equal to 1.0, and hence the formation of the air gap 84 helps reduce the parasitic capacitance or leakage between the portions of the gate electrodes 56 separated by the dielectric layer 78 having the air gap 84. The source/drain contacts 94 and gate contacts 92 may be formed in different processes, or may be formed in the same process.

Embodiment processes and devices advantageously dispose an air gap or void between two cut ends of a replacement gate (e.g., metal gate) of adjacent FinFET devices, resulting from a replacement gate cutting process. The air gap or void provides better insulating properties over a dielectric material alone and as such, the leakage current from one metal gate to the adjacent metal gate (resulting from the cutting of a larger metal gate structure) is reduced. Additional advantages include that the dielectric layer having the air gap formed therein is formed by an ALD process, which leads to improved film quality over a dielectric layer formed by a CVD process.

An embodiment is method. The method includes forming fins from a substrate, forming a dummy gate stack over portions of the fins, forming epitaxial source/drain regions adjacent the dummy gate stack, depositing a first inter-layer dielectric (ILD) over the epitaxial source/drain region, replacing the dummy gate stack with a first gate stack, forming a trench through the first gate stack and into an isolation region under the first gate stack, and forming a dielectric layer in the trench by an atomic layer deposition process, wherein the dielectric layer is non-conformal.

Another embodiment is a method. The method includes flowing a first precursor into a processing chamber to form a monolayer on a sidewall and a bottom of a trench disposed over a substrate and flowing a second precursor and a first hydrogen-containing gas into the processing chamber. The second precursor is flowed into the processing chamber at a first flow rate, the first hydrogen-containing gas is flowed into the processing chamber at a second flow rate, and the second precursor reacts with the monolayer to form a dielectric layer. The method further includes flowing a nitrogen-containing gas and a second hydrogen-containing gas into the processing chamber, and the nitrogen-containing gas is flowed into the processing chamber at a third flow rate, the second hydrogen-containing gas is flowed into the processing chamber at a fourth flow rate, and a first ratio of the second flow rate to the first flow rate is different from a second ratio of the fourth flow rate to the third flow rate. The method further includes flowing the first precursor into the processing chamber and flowing the second precursor into the processing chamber to increase a thickness of the dielectric layer non-uniformly.

A further embodiment is a semiconductor device structure. The structure includes a gate electrode disposed over a channel region. The gate electrode includes a work function tunning layer including an inner portion having a first hydrogen concentration and an outer portion having a second hydrogen concentration substantially greater than the first hydrogen concentration. The gate electrode further includes a fill material disposed on the work function tunning layer. The structure further includes a dielectric layer in contact with the gate electrode, and an air gap is formed in the dielectric layer. The outer portion of the work function tunning layer is in contact with the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming fins from a substrate;
    forming a dummy gate stack over portions of the fins;
    forming epitaxial source/drain regions adjacent the dummy gate stack;
    depositing a first inter-layer dielectric (ILD) over the epitaxial source/drain region;
    replacing the dummy gate stack with a first gate stack;
    forming a trench through the first gate stack and into an isolation region under the first gate stack; and
    forming a dielectric layer in the trench by an atomic layer deposition process, wherein the dielectric layer is non-conformal; and the atomic layer deposition process comprises:
        flowing a first precursor into a processing chamber;
        flowing a second precursor into the processing chamber to form a conformal dielectric layer;
        performing a treatment process on the conformal dielectric layer;
        flowing the first precursor into the processing chamber; and
        flowing the second precursor into the processing chamber to increase the thickness of the conformal dielectric layer non-uniformly.

2. The method of claim 1, wherein the dielectric layer has a first portion located at an opening of the trench and a second portion located near a bottom of the trench, and the first portion has a first thickness substantially greater than a second thickness of the second portion.

3. The method of claim 1, wherein the first gate stack comprises a gate electrode and a gate dielectric layer.

4. The method of claim 3, further comprising forming a hard mask on the gate electrode and the gate dielectric layer.

5. The method of claim 4, wherein the forming the trench comprises removing a portion of the hard mask and a portion of the first gate stack to separate the first gate stack into first gate stack portions.

6. The method of claim 1, further comprising forming a second gate stack, wherein the trench is formed through the second gate stack and into the isolation region.

7. The method of claim 6, further comprising extending the trench through the isolation region and into the substrate.

8. A method, comprising:
    flowing a first precursor into a processing chamber to form a monolayer on a sidewall and a bottom of a trench disposed over a substrate, wherein the trench extends through a gate stack;
    flowing a second precursor and a first hydrogen-containing gas into the processing chamber, wherein the second precursor is flowed into the processing chamber at a first flow rate, the first hydrogen-containing gas is flowed into the processing chamber at a second flow rate, and the second precursor reacts with the monolayer to form a dielectric layer;

flowing a nitrogen-containing gas and a second hydrogen-containing gas into the processing chamber, wherein the nitrogen-containing gas is flowed into the processing chamber at a third flow rate, the second hydrogen-containing gas is flowed into the processing chamber at a fourth flow rate, and a first ratio of the second flow rate to the first flow rate is different from a second ratio of the fourth flow rate to the third flow rate;

flowing the first precursor into the processing chamber; and flowing the second precursor into the processing chamber to increase a thickness of the dielectric layer non-uniformly.

9. The method of claim 8, wherein the first ratio ranges between about 0.4 sccm to about 1 sim and about 0.9 sccm to about 1 slm, and the second ratio ranges between 5 sccm to about 1 slm and about 20 sccm to about 1 slm.

10. The method of claim 8, further comprising filling the trench with the dielectric layer, wherein an air gap is formed in the dielectric layer.

11. The method of claim 8, wherein the first precursor comprises $SiI_2H_2$ and the second precursor comprises $N_2$.

12. The method of claim 8, wherein the first precursor comprises dichlorosilane and the second precursor comprises $NH_3$.

13. The method of claim 8, wherein the first and second hydrogen-containing gas comprises $H_2$.

14. A method, comprising:
forming fins from a substrate;
forming a gate stack over portions of the fins;
forming a trench through the gate stack; and
forming a non-conformal dielectric layer in the trench by an atomic layer deposition process, wherein the atomic layer deposition process comprises:
flowing a first precursor into a processing chamber;
flowing a second precursor into the processing chamber to form a conformal dielectric layer;
performing a treatment process on the conformal dielectric layer;
flowing the first precursor into the processing chamber; and
flowing the second precursor into the processing chamber to increase the thickness of the conformal dielectric layer non-uniformly.

15. The method of claim 14, wherein the non-conformal dielectric layer comprises SiN.

16. The method of claim 14, wherein the treatment process is a plasma treatment process.

17. The method of claim 16, wherein the plasma treatment process modifies surface bonds of the conformal dielectric layer to be hydrogenated.

18. The method of claim 16, wherein the plasma treatment process comprises exposing the conformal dielectric layer to active species.

19. The method of claim 18, wherein a top portion of the conformal dielectric layer is exposed to more active species than a bottom portion of the conformal dielectric layer.

20. The method of claim 14, wherein forming of the non-conformal layer further comprises forming a void in the non-conformal layer.

* * * * *